(12) United States Patent  (10) Patent No.: US 9,165,893 B2
Kim et al.  (45) Date of Patent: Oct. 20, 2015

(54) SEMICONDUCTOR DEVICE INCLUDING COUPLING CONDUCTIVE PATTERN

(75) Inventors: Yong-Hoon Kim, Suwon-si (KR);
Jong-Joo Lee, Suwon-si (KR);
Sang-Youb Lee, Hwaseong-si (KR);
Young-Don Choi, Seoul (KR);
Hee-Seok Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 1076 days.

(21) Appl. No.: 13/229,193

(22) Filed: Sep. 9, 2011

(65) Prior Publication Data
US 2012/0064827 A1 Mar. 15, 2012

(30) Foreign Application Priority Data

Sep. 14, 2010 (KR) .......... 10-2010-0090095

(51) Int. Cl.
*H04B 5/00* (2006.01)
*H01L 23/64* (2006.01)
*H01L 25/10* (2006.01)
*H01L 23/00* (2006.01)

(52) U.S. Cl.
CPC ............ *H01L 23/645* (2013.01); *H01L 25/105* (2013.01); *H04B 5/0031* (2013.01); *H04B 5/0037* (2013.01); *H01L 24/48* (2013.01); *H01L 2224/16145* (2013.01); *H01L 2224/16225* (2013.01); *H01L 2224/32145* (2013.01); *H01L 2224/32225* (2013.01); *H01L 2224/48225* (2013.01); *H01L 2224/48227* (2013.01); *H01L 2224/73253* (2013.01); *H01L 2224/73265* (2013.01); *H01L 2225/06558* (2013.01); *H01L 2225/1023* (2013.01); *H01L 2924/01019* (2013.01); *H01L 2924/15311* (2013.01); *H01L 2924/3025* (2013.01); *H01L 2924/30107* (2013.01); *H01L 2924/3511* (2013.01); *H04B 5/0012* (2013.01); *H04B 5/0075* (2013.01)

(58) Field of Classification Search
CPC ..................................... H04B 5/0031
USPC ............... 455/41.1; 257/98, 99, 706, 724; 428/209
See application file for complete search history.

(56) References Cited

U.S. PATENT DOCUMENTS 6,953,994 B2  10/2005 Kaewell, Jr.
2007/0080360 A1*  4/2007 Mirsky et al. ........... 257/99

FOREIGN PATENT DOCUMENTS

JP  2005-203657  7/2005
JP  2005-228981  8/2005

* cited by examiner

*Primary Examiner* — Hsin-Chun Liao
(74) *Attorney, Agent, or Firm* — Myers Bigel Sibley & Sajovec, P.A.

(57) ABSTRACT

A semiconductor device is disclosed including a through electrode. The semiconductor device may include a first semiconductor chip including a transceiver circuit formed on a first surface, a first coupling conductive pattern which is formed on a second surface opposite the first surface, and a through electrode which connects the transceiver circuit and the first coupling conductive pattern. There may be a transceiver located on a second semiconductor chip and including a second coupling conductive pattern facing the first coupling conductive pattern which communicates wirelessly with the first coupling conductive pattern.

6 Claims, 41 Drawing Sheets

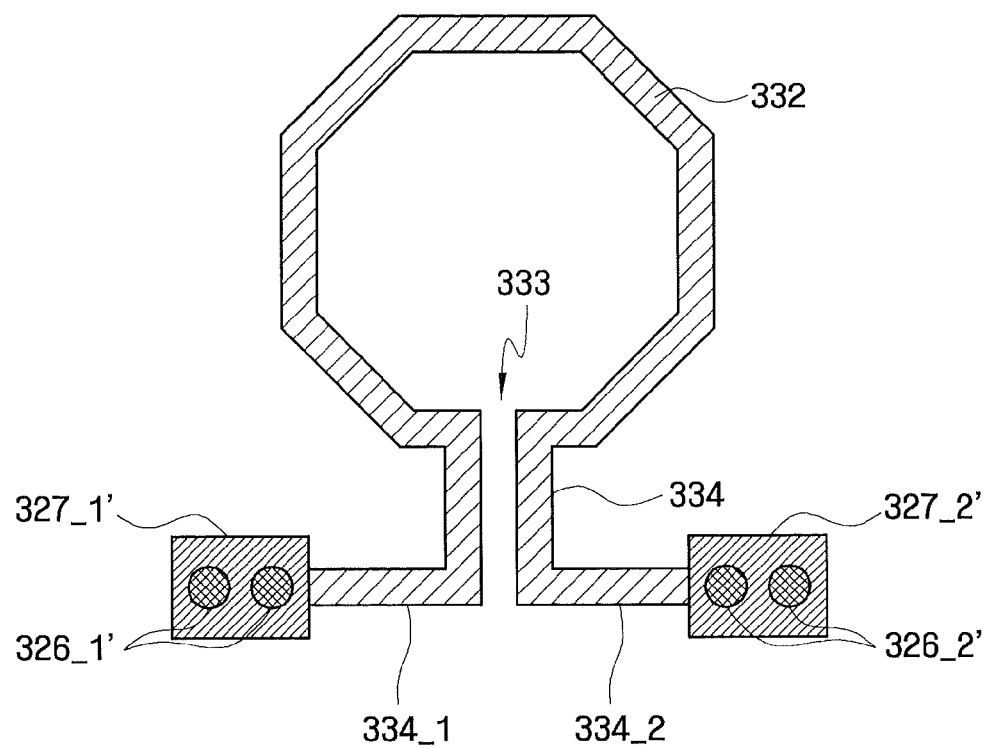

SEMICONDUCTOR DEVICE INCLUDING COUPLING CONDUCTIVE PATTERN

This application claims priority from Korean Patent Application No. 10-2010-0090095 filed on Sep. 14, 2010 in the Korean Intellectual Property Office, the disclosure of which is incorporated herein by reference in its entirety.

BACKGROUND

1. Field of the Invention

The present disclosure relates to semiconductor devices.

2. Description of the Related Art

Some types of semiconductor devices currently used in high-performance electronic devices may benefit from increased operating speed. Attempts have been made in the art to integrate devices in a smaller and higher speed device.

One method of improving high-performance semiconductor devices may include stacking semiconductor chips or semiconductor packages. Examples may include multi-chip package technology mounting a plurality of chips in one package, system-in package technology, and a package-on-package technology which stacks a plurality of semiconductor packages using, for example, solder bumps and laser drilling.

SUMMARY

Aspects of embodiments of the present inventive concepts provide a semiconductor device having improved transmission efficiency by including a through electrode and a coupling conductive pattern for wireless communication between a semiconductor chip and an adjacent transceiver. The chip and transceiver may be stacked. The semiconductor chip may include a through electrode penetrating the semiconductor material or a package containing the semiconductor. The semiconductor device may improve transmission efficiency by including a coupling conductive pattern in a package substrate for wireless communication between semiconductor packages that are stacked. Communications between separate circuits or chips or packages may include parallel wireless and wired transmission of either power and/or signals or direct transmission of power and wireless transmission of signals, or various combinations thereof.

Other aspects of the present inventive concepts may also provide improved operating characteristics by exchanging signals and power using separate paths between a semiconductor chip and a transceiver that are stacked, for example by wireless transmission and direct electrical contact, either in parallel or separately.

However, the limits of the present inventive concepts are not restricted to the embodiments set forth herein. The above and other aspects of the disclosed inventive concepts will become more apparent to one of ordinary skill in the art to which the present invention pertains by referencing to the detailed description given below.

BRIEF DESCRIPTION OF THE DRAWINGS

FIGS. 4A through 4E are perspective, cross section and plan views of a portion A of FIG. 2B according to exemplary embodiments of the present inventive concepts;

DETAILED DESCRIPTION

Figure 1:
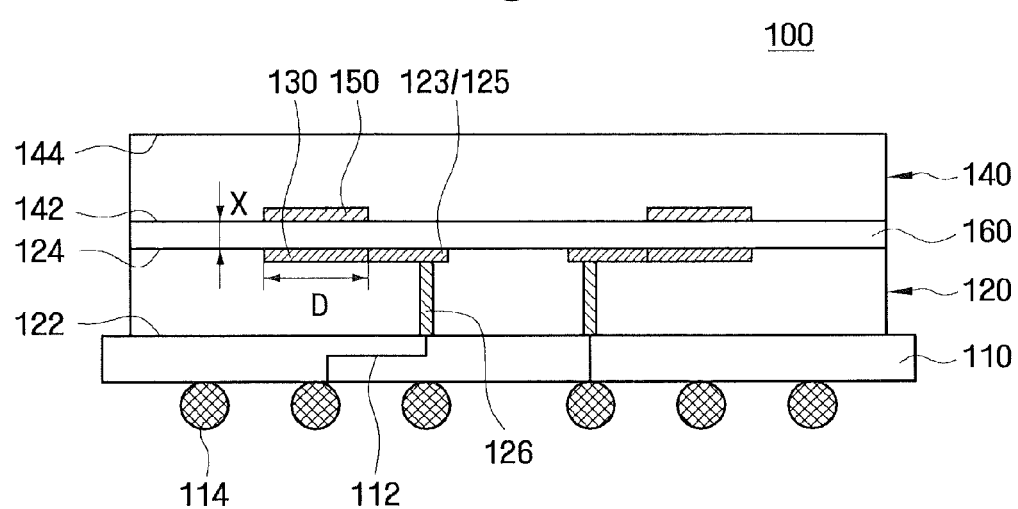
FIG. 1 is a cross-sectional view of a semiconductor device according to an exemplary embodiment of the present inventive concepts.

Advantages and features of the present inventive concepts and methods of accomplishing the same may be understood more readily by reference to the following detailed description of exemplary embodiments and the accompanying drawings. The present inventive concepts may, however, be embodied in many different forms and should not be construed as being limited to the embodiments set forth herein. Rather, these embodiments are provided so that this disclosure will be thorough and complete and will fully convey the concept of the inventive concepts to those skilled in the art, and the present invention should only be defined by the appended claims. Like reference numerals refer to like elements throughout the specification. In the drawings, sizes and relative sizes of layers and regions may be exaggerated for clarity.

It will be understood that when an element or layer is referred to as being "on" another element or layer, the element or layer can be, directly on another element or layer or intervening elements or layers may also be present. In contrast, when an element is referred to as being "directly on" another element or layer, there are no intervening elements or layers present. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. Throughout the specification, like reference numerals in the drawings denote like elements.

Embodiments of the inventive concept are described herein with reference to plan and cross-section illustrations that are schematic illustrations of idealized embodiments of the inventive concept. As such, variations from the shapes of the illustrations as a result, for example, of manufacturing techniques and/or tolerances, are to be expected. Thus, the inventive concept should not be construed as limited to the particular shapes of regions illustrated herein, but should include deviations in shapes that result, for example, from manufacturing. Thus, the regions illustrated in the figures are schematic in nature and their shapes are not intended to illustrate the actual shape of a region of a device and are not intended to limit the scope of the invention.

Illustrative embodiments of the inventive concept will now be described more fully with reference to the accompanying drawings, in which exemplary embodiments of the invention are shown.

FIG. 1 is a cross-sectional view of a semiconductor device 100 according to an exemplary embodiment of the present inventive concept. In the following description, a semiconductor package will be used as an example of the semiconductor device 100 shown in FIG. 1. However, the semiconductor device 100 should not be limited to the illustrated semiconductor package.

Referring to FIG. 1, the semiconductor device 100 according to the current exemplary embodiment includes a package substrate 110, a semiconductor chip 120, and a transceiver 140. The semiconductor chip 120 and the transceiver 140 may be sequentially stacked on the package substrate 110.

The package substrate 110 may include circuit patterns 112 which are connected to the semiconductor chip 120. The semiconductor chip 120 may be electrically connected to the outside of the semiconductor device 100 by the circuit patterns 112. The package substrate 110 may further include conductive media 114 which connect the semiconductor device 100 to the outside. The conductive media 114 may be one of conductive bumps, conductive spacers, solder balls, a pin grid array (PGA), and a combination of the same. When the semiconductor chip 120 is a wafer-level package, the package substrate 100 may be a module board.

The semiconductor chip 120 may include a first surface 122 and a second surface 124 which is different from the first surface 122. As shown in the drawing, the first surface 122 may be an active surface, and the second surface 124 may be a backside surface. However, the present invention is not limited thereto. For example, the first surface 122 may be a surface that faces the transceiver 140, and the second surface 124 may be a surface that is opposite the transceiver 140.

The semiconductor chip 120 may include a semiconductor substrate (not shown). Examples of the semiconductor substrate may include, but are not limited to, a silicon substrate, a silicon-on-insulator (SOI) substrate, and a silicon germanium substrate.

One or more circuit portions (not shown) which implement various functions of the semiconductor chip 120 and internal wiring patterns which connect the circuit portions may be formed on the first surface 122. On the other hand, no circuit portions may be formed on the second surface 124. When necessary, redistribution layers (RDLs) may be formed on the second surface 124. In addition, an insulating film may be formed on the second surface 124, or a surface of the semiconductor substrate may be exposed.

The semiconductor chip 120 may include through electrodes 126 which penetrate at least part of the semiconductor chip 120. The through electrodes 126 may penetrate the semiconductor substrate. The through electrodes 126 may be, for example, through silicon vias. An end of each of the through electrodes 126 may extend toward the first surface 122 of the semiconductor chip 120, and the other end thereof may extend toward the second surface 124. The first and second surfaces 122 and 124 of the semiconductor chip 120 may be electrically connected to each other by the through electrodes 126. The through electrodes 126 may be formed before or after the circuit portions are formed. For example, the through electrodes 126 may be formed before or while the circuit portions are formed and may be electrically connected to the circuit portions by the internal wiring patterns. Alternatively, the through electrodes 126 may be formed after the circuit portions and the internal wiring patterns are formed and may be connected to the circuit portions by additional wiring patterns.

First coupling conductive patterns 130 may be formed on the first surface 122 of the semiconductor chip 120. However, the present invention is not so limited thereto. As will be described later the first coupling conductive patterns 130 may also be formed on the second surface 124. The first coupling conductive patterns 130 are used for wireless communication between the semiconductor chip 120 and the transceiver 140. The semiconductor chip 120 may exchange signals and/or power with the transceiver 140 in an inductive or capacitive coupling manner by using the first coupling conductive patterns 130.

The first coupling conductive patterns 130 may be implemented in a number of ways. For example, as shown in the drawing, the first coupling conductive patterns 130 may be formed on the second surface 124 as part of the RDLs 125 or as part of the internal wiring patterns 123. Alternatively, the first coupling conductive patterns 130 may be formed on the first surface 122 at the same time as internal wiring patterns 123. Alternatively, the first coupling conductive patterns 130 may be formed separately and then attached to the first surface 122 of the semiconductor chip 120. The first coupling conductive patterns 130 may be electrically connected to the semiconductor chip 120 and/or the package substrate 110 by the through electrodes 126. For example, the through electrodes 126 may electrically connect the circuit portions of the semiconductor chip 120 to the first coupling conductive patterns 130. In another example, the through electrodes 126 may be electrically insulated from the circuit portions of the semiconductor chip 120 and connect the package substrate 110 to the first coupling conductive patterns 130. Signals and/or power may be delivered from the semiconductor chip 120 and/or the package substrate 110 to the first coupling conductive patterns 130 via the through electrodes 126.

The transceiver 140 may be stacked on the semiconductor chip 120. The transceiver 140 may be a semiconductor chip (e.g., FIGS. 2A, 2B, and 11) or a package substrate of another semiconductor package (e.g., FIGS. 12, 13, 14, 15A, 16, 17A, and 18). Examples of the transceiver 140 are not limited to the above examples and may include various electronic devices that can communicate wirelessly with the semiconductor chip 120. For wireless communication, the transceiver 140 may be separated from the semiconductor chip 120 by a selected distance denoted as X in FIG. 1. The transceiver 140 may include a first surface 142 which faces the semiconductor chip 120 and a second surface 144 which is opposite the first surface 142 and faces in an opposite direction to the semiconductor chip 120.

Second coupling conductive patterns 150 may be formed on the first surface 142 of the transceiver 140 to face the first coupling conductive patterns 130. The second coupling conductive patterns 150 may have the same or similar shape as the first coupling conductive patterns 130. Signals and/or power needed to operate the transceiver 140 may be supplied to the transceiver 140 through the second coupling conductive patterns 150. Signals and/or power needed to operate the transceiver 140 may be delivered to the first coupling conductive patterns 130 via the through electrodes 126 and then may be supplied wirelessly to the transceiver 140 through the second coupling conductive patterns 150.

Specifically, in an embodiment where the first and second coupling conductive patterns 130 and 150 form a capacitor, the semiconductor chip 120 and the transceiver 140 communicate with each other in a capacitive coupling manner. In an embodiment where the first and second coupling conductive patterns 130 and 150 form an inductor, the semiconductor chip 120 and the transceiver 140 communicate with each other in an inductive coupling manner. The semiconductor device 100 according to the current exemplary embodiment may further include an adhesive layer 160 between the semiconductor chip 120 and the transceiver 140. The transceiver 140 may be fixed onto the semiconductor chip 120 by the adhesive layer 160. For example, when each of the first and second coupling conductive patterns 130 and 150 includes an inductor, the adhesive layer 160 may comprise an epoxy material. In another example, when each of the first and second coupling conductive patterns 130 and 150 includes a capacitor, the adhesive layer 160 may contain a high-k material, which may be located between the first and second coupling conductive patterns 130 and 150.

The semiconductor device 100 may further include a protective material (not shown) which at least partially covers the package substrate 110 and the semiconductor chip 120. Examples of the protective material may include an underfill material and/or an epoxy molding compound (EMC).

According to the current exemplary embodiment, the first and second coupling conductive patterns 130 and 150 may be placed to face each other for wireless communication. In addition, no semiconductor substrate may be interposed between the first and second coupling conductive patterns 130 and 150, thereby reducing a communication distance and improving transmission efficiency. The reduced communication distance may reduce the interference between adjacent coupling conductive patterns, which, in turn, reduces the gap between the coupling conductive patterns and the size of the semiconductor device 100.

Furthermore, conductive media for physical and electrical contact between the semiconductor chip 120 and the transceiver 140 may not be formed. The absence of the conductive media may decrease the height of the semiconductor package (i.e., the semiconductor device 100) and eliminate connection defects between the semiconductor chip 120 and the transceiver 140 which result from contact defects of the conductive media due to warpage and/or misalignment.

Figure 2A:
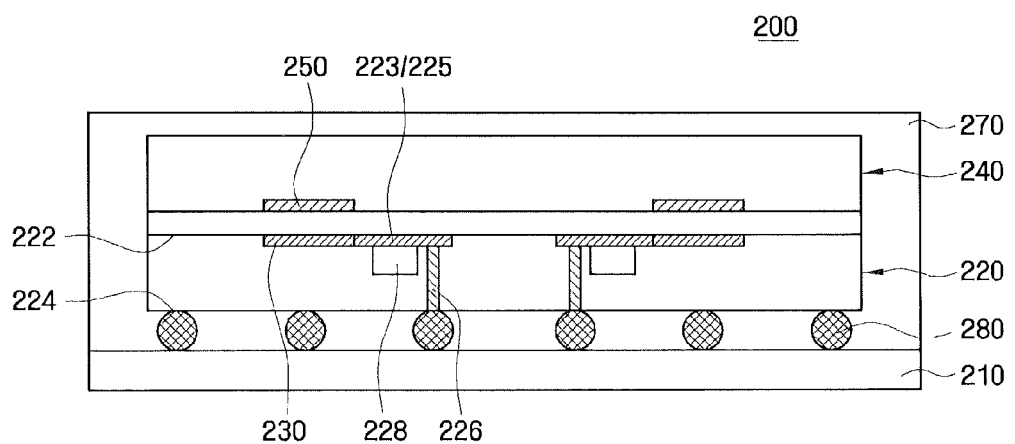
FIGS. 2A and 2B are cross-sectional views of semiconductor devices according to another exemplary embodiment of the present inventive concepts.
Figure 2B:
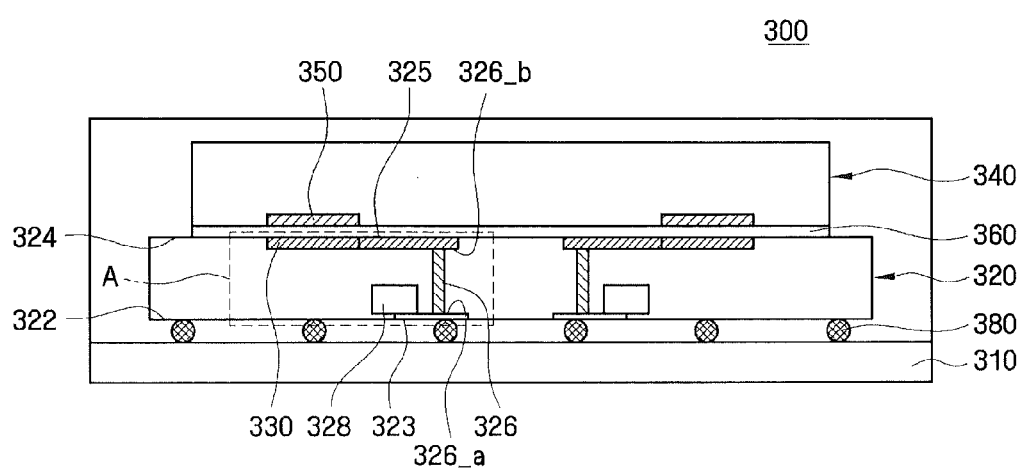

FIGS. 2A and 2B are cross-sectional views of semiconductor devices 200 and 300 according to other exemplary embodiments of the present inventive concepts. The following description will focus on differences from the semiconductor device 100 of FIG. 1. In addition, terms similar to those used in the description of FIG. 1 may be used indicate elements similar to the semiconductor device 100 of FIG. 1.

Referring to FIG. 2A, a semiconductor chip 220 may be mounted on a package substrate 210 in a face-up manner. That is, a second surface 224 of the semiconductor chip 220 may face the package substrate 210, and a first surface 222 of the semiconductor chip 220 may face in an opposite direction to the package substrate 210.

Circuit portions 228 may be electrically connected to the package substrate 210 by through electrodes 226. An end of the through electrodes 226 may be connected to a corresponding one of the circuit portions 228 by a corresponding one of the internal wiring patterns 223 on the side of the first surface 222. The other end of each of the through electrodes 226 may extend toward the second surface 224 of the semiconductor chip 220 to be exposed at the second surface 224. The exposed through electrodes 226 may be electrically and physically connected to the package substrate 210 by conductive media 280. The conductive media 280 may be one of conductive bumps, solder balls, and an anisotropic conductive film (ACF).

First coupling conductive patterns 230 may be formed on the first surface 222 of the semiconductor chip 220. The first coupling conductive patterns 230 may be formed on the first surface 222 using the RDLs 225 or the internal wiring patterns 223. Alternatively, the first coupling conductive patterns 230 may be formed separately and then attached to the first surface 222. The first coupling conductive patterns 230 may be electrically connected to the circuit portions 228 by the internal wiring patterns 223, respectively. Each of the circuit portions 228 may include a functional circuit portion which operates in response to a signal that is transmitted or received through a corresponding one of the first coupling conductive patterns 230. When the signal that is transmitted or received through the corresponding one of the first coupling conductive patterns 230 is a memory control signal, each of the circuit portions 228 may include a memory control circuit. In another example, each of the circuit portions 228 may further include a transceiver circuit which transmits or receives signals through a corresponding one of the first coupling conductive patterns 230. The transceiver circuit may include a transmitter circuit and/or a receiver circuit. That is, when the size of a signal received from each of the first coupling conductive patterns 230 is small, the transceiver circuit may amplify the received signal and deliver the amplified signal to the memory control circuit.

Signals and/or power can be transmitted or received through the first coupling conductive patterns 130, which may be electrically connected to one transceiver circuit, and a transmitting mode or a receiving mode may be determined by a switch. Alternatively, transmitting coupling conductive patterns and receiving coupling conductive patterns may be formed separately. Each of the transmitting coupling conductive patterns may be electrically connected to the receiver circuit, and each of the receiving coupling conductive patterns may be electrically connected to the transmitter circuit.

A transceiver 240 may include second coupling conductive patterns 250 for wireless communication with the first coupling conductive patterns 230. For wireless communication, the transceiver 240 may be separated from the semiconductor chip 220 by a selected distance. The second coupling conductive patterns 250 may face the first coupling conductive patterns 230. The size of the transceiver 240 may be smaller than or equal to that of the semiconductor chip 220.

A semiconductor chip 320 according to the embodiment of FIG. 2B may be mounted on a package substrate 310 in a face-down manner. That is, a first surface 322 of the semiconductor chip 320 may face the package substrate 310, and a second surface 324 thereof may face in an opposite direction to the package substrate 310. For example, the semiconductor chip 320 may be mounted on the package substrate 310 in a flip-chip manner.

First coupling conductive patterns 330 may be formed on the second surface 324 of the semiconductor chip 320. The first coupling conductive patterns 330 may be formed at the same time as RDLs 325 on the second surface 324. Alternatively, the first coupling conductive patterns 330 may be formed separately and then attached to the second surface 324.

Circuit portions 328 may be electrically connected to the first coupling conductive patterns 330 by through electrodes 326. An end 326_*a* of each of the through electrodes 326 may extend toward the first surface 322 of the semiconductor chip 320 and may be connected to a corresponding one of the circuit portions 328 by a corresponding one of internal wiring patterns 323. The other end 326_*b* of each of the through electrodes 326 may extend toward the second surface 324 of the semiconductor chip 320 and may be connected to a corresponding one of the first coupling conductive patterns 330. The first coupling conductive patterns 330 may exchange signals and/or power with the circuit portions 328 via the through electrodes 326.

The semiconductor chip 320 may be electrically and physically connected to the package substrate 310 by conductive media 380. The conductive media 380 may be one of conductive bumps, solder balls, and an anisotropic conductive film (ACF).

A transceiver 340 may include second coupling conductive patterns 350 which face the first coupling conductive patterns 330. The size of the transceiver 340 may be smaller than or equal to that of the semiconductor chip 320.

According to the embodiments of FIGS. 2A and 2B, the first coupling conductive patterns 230 and 330 are placed to face the second coupling conductive patterns 250 and 350. This can reduce the distance between the first coupling conductive patterns 230 and 330 and the second coupling conductive patterns 250 and 350, thereby improving signal transmission efficiency. In addition, since the semiconductor chips 220 and 320 include the through electrodes 226 and 326, even when the first coupling conductive patterns 230 are, for example, mounted on the first surface 222 of the semiconductor chip 210 in a face-up manner as in the semiconductor device 200 of FIG. 2A, they can be placed to face the second coupling conductive patterns 250. In another example, even when the first coupling conductive patterns 330 are mounted on the second surface 324 of the semiconductor chip 310 in a face-down manner as in the semiconductor device 300 of FIG. 2B, they can be placed to face the second coupling conductive patterns 350 and can be connected to the circuit portions 328 by the through electrodes 326.

Figure 3:
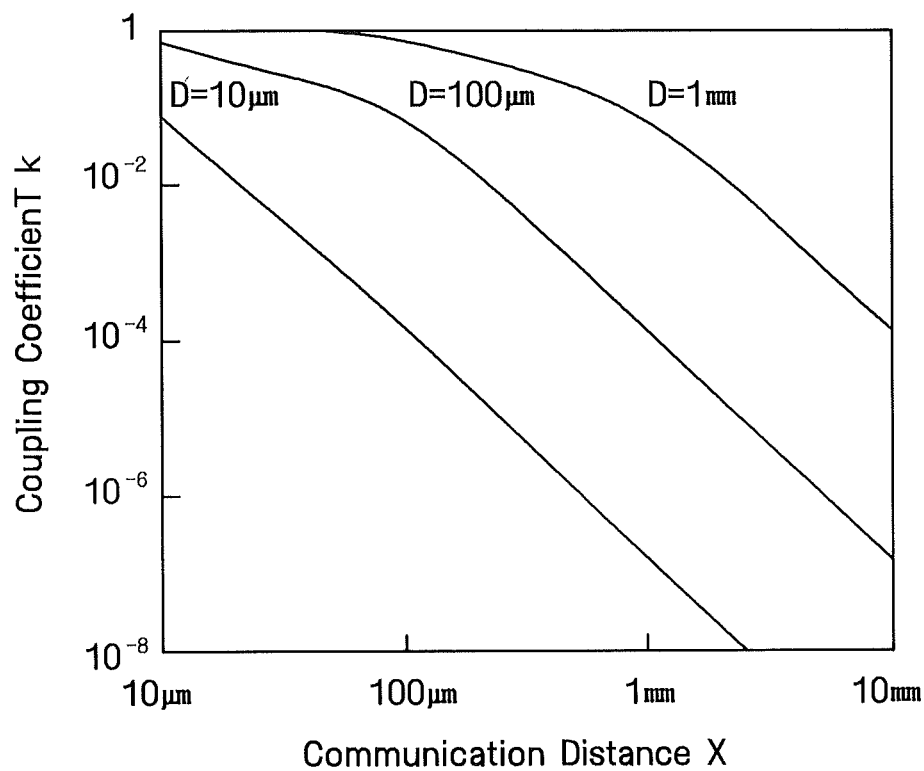
FIG. 3 is a graph illustrating coupling efficiency with respect to the communication distance and the size of coupling conductive patterns.

FIG. 3 is a graph illustrating the relationship between a communication distance X and a coupling coefficient k with respect to a size D of coupling conductive patterns.

Referring to FIGS. 1 and 3, the communication distance X is the distance between the first and second coupling conductive patterns 130 and 150 which exchange signals with each other. The coupling coefficient k has a value greater than zero and less than one and indicates the efficiency of signal transmission between the first and second coupling conductive patterns 130 and 150.

Referring to FIG. 3, the smaller the communication distance X, the greater the signal transmission efficiency. For example, when the first and second coupling conductive patterns 130 and 150 which communicate wirelessly with each other are placed to face each other without the semiconductor chip 120 interposed therebetween as in the embodiment of FIG. 1, the communication distance X can be reduced by a thickness of the semiconductor chip 120, compared with a case where the semiconductor chip 120 is interposed between the first and second coupling conductive patterns 130 and 150.

The adhesive layer 160 may be interposed between the first and second coupling conductive patterns 130 and 150. For example, when the size D of the first coupling conductive patterns 130 is 100 μm, when the thickness of the semiconductor chip 120 is approximately 100 μm, and when the thickness of the adhesive layer 160 is approximately 10 μm, the communication distance X can be reduced by approximately 100 μm according to an exemplary embodiment of the present invention. Therefore, transmission efficiency can be increased by more than approximately 50 times, compared with a case where the semiconductor chip 120 is interposed between the first and second conductive patterns 130 and 150.

Figure 4A:
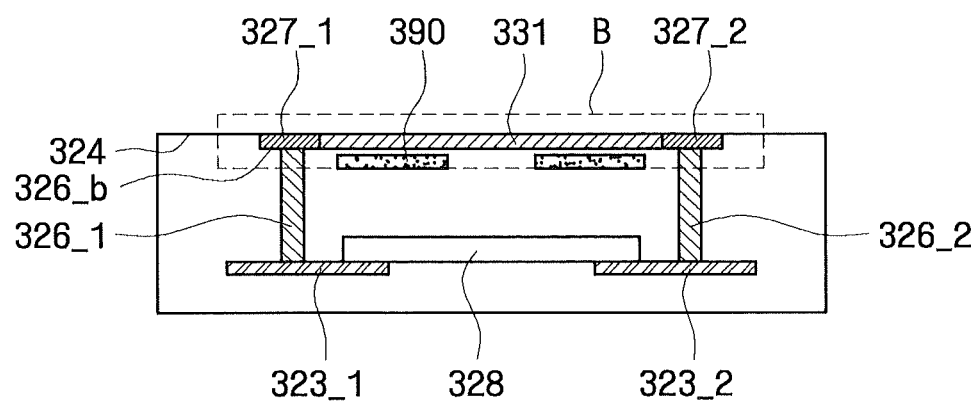
Figure 4B:
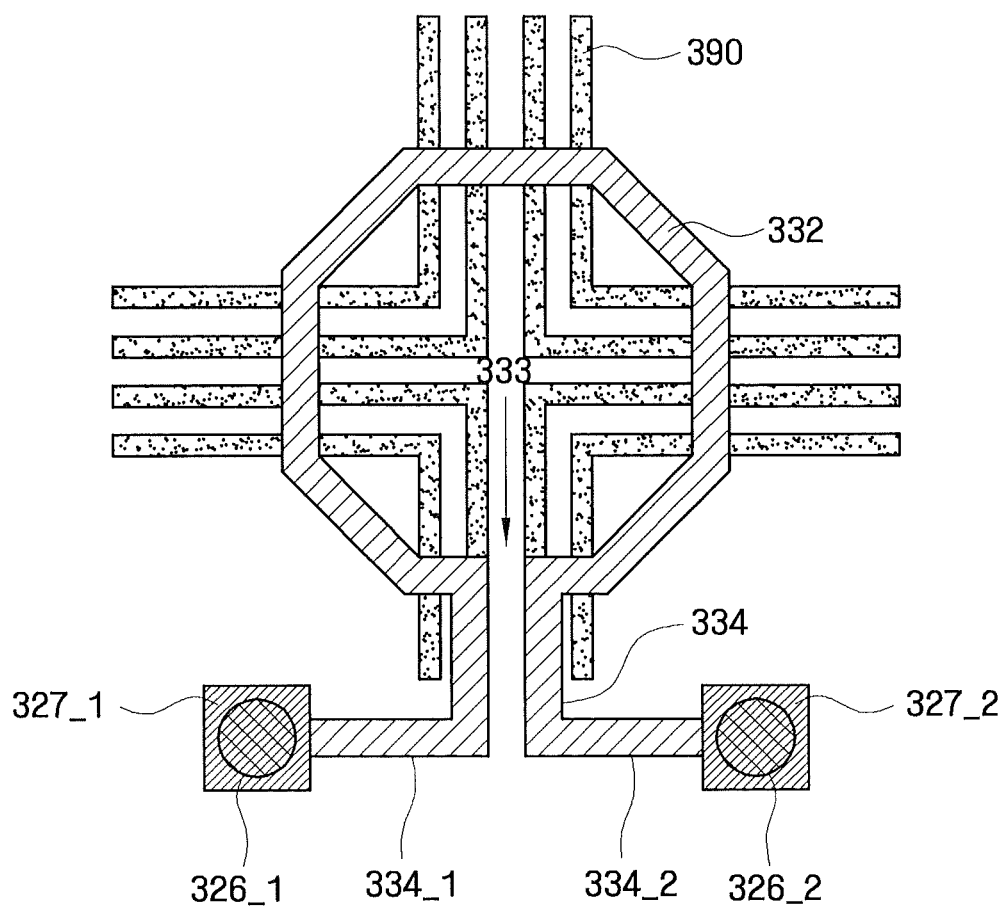
Figure 4C:
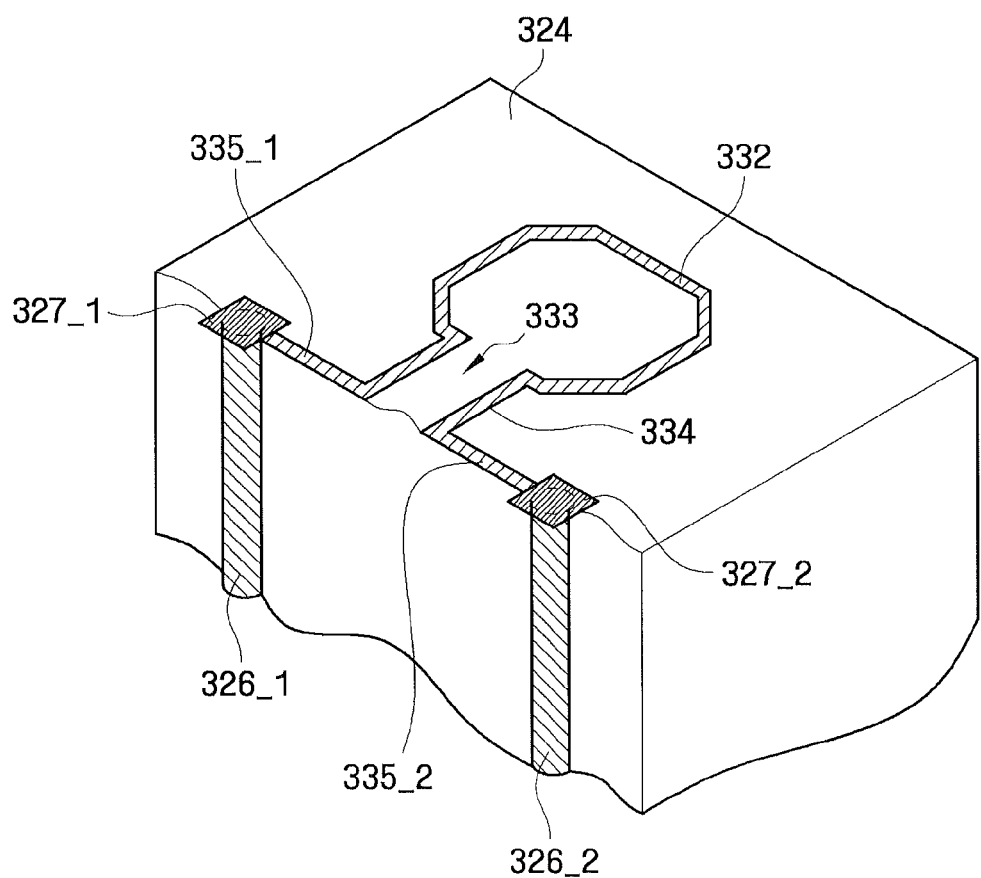

FIGS. 4A through 4C respectively are cross section, plan, and perspective views of the semiconductor device 300 according to the embodiment of FIG. 2B.

Referring to FIGS. 2B and 4A, a portion A of the semiconductor chip 320 may be configured as shown in FIG. 4A. For example, each of the first coupling conductive patterns 330 may include an inductor 331. Each of the through electrodes 326 may include a first through electrode 326_1 and a second through electrode 326_2. The inductor 331 may be electrically connected to each of the circuit portions 328 by the first and second through electrodes 326_1 and 326_2. Each of the circuit portions 328 may be connected to the first and the second through electrodes 326_1 and 326_2 by internal wiring patterns 323_1 and 323_2, respectively. First and second contact pads 327_1 and 327_2 may further be formed on the other ends 326_*b* of the first and second through electrodes 326_1 and 326_2, respectively. The first contact pad 327_1 and/or the second contact pad 327_2 may be part of each of the RDLs 325 as seen in FIG. 2B. The inductor 331 may be connected to the first and second through electrodes 326_1 and 326_2 by the first and second contact pads 327_1 and 327_2, respectively. The first and second contact pads 327_1 and 327_2 may be formed at the same level as, or at a different level from the inductor 331. Here, the term "the same level" may denote the same plane as well as a surface of the same material having different heights.

Shielding patterns 390 may be formed under the inductor 331. The shielding patterns 390 may be formed at a different level from a field portion 332, as shown in FIG. 4B. A ground voltage may be applied to the shielding patterns 390. The shielding patterns 390 may be formed as a plate or conducting wire patterns.

FIGS. 4B and 4C are plan and perspective views of a portion B of FIG. 4A. Referring to FIG. 4B, the inductor 331 may include the field portion 332 and a pair of lead portions 334 which are connected to the field portion 332. The field portion 332 in this embodiment may include a conducting wire in the form of a single line that forms a loop shape or another shape, such as a spiral. When current flows through the conducting wire, a magnetic field is generated in the conducting wire. The conducting wire of the field portion 332 may be shaped like an open loop having an open area 333.

The lead portions 334 may be connected to both ends of the open area 333 of the field portion 332 such that current can flow through the field portion 332. The lead portions 334 may function as a terminal which electrically connects the field portion 332 to other elements of the semiconductor chip 320, such as a transistor or capacitor element of each of the circuit portions 328 or the through electrodes 326. For example, the first through electrode 326_1 may be connected to the field portion 332 by a first lead portion 334_1, and the second through electrode 326_2 may be connected to the field portion 332 by a second lead portion 334_2. In another example, the first and second contact pads 327_1 and 327_2 connected respectively to the first and second through electrodes 326_1 and 326_2 may function as the lead portions 334.

Figure 4D:
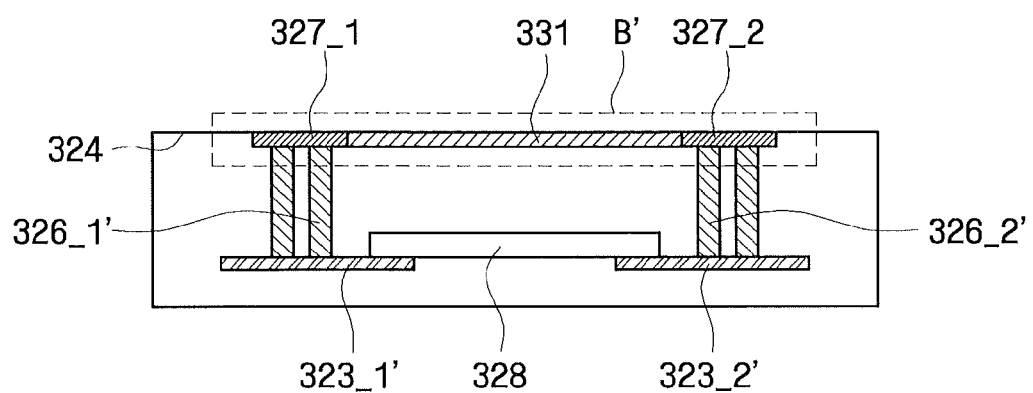

Referring to FIGS. 4D and 4E, a first through electrode 326_1' and/or a second through electrode 326_2' may be formed as a double through electrode. The double through electrode may include at least two through electrodes which are connected to one contact pad. For example, the first through electrode 326_1' may include two through electrodes, and the two through electrodes may be connected to a first contact pad 327_1'. In addition, the two through electrodes may be connected to each other by an internal wiring pattern 323_1'. The presence of the double through electrode can prevent a situation where the inductor 331 is not connected to each of the circuit portions 328 due to defects generated in the process of forming through electrodes.

Figure 5A:
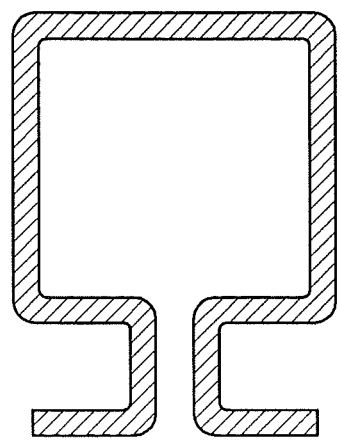
FIGS. 5A through 5C are plan views showing various shapes of an inductor shown in FIGS. 4A through 4E according to exemplary embodiments of the present inventive concepts.
Figure 5B:
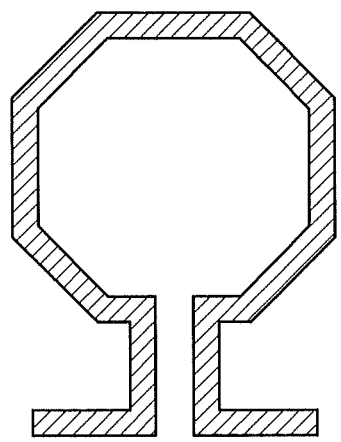
Figure 5C:
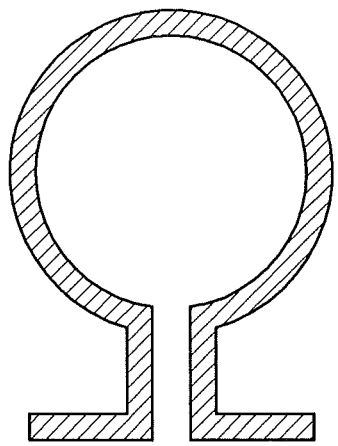

FIGS. 5A through 5C are plan views showing embodiments of various shapes of the inductor 331 of FIG. 4A. Referring to FIGS. 4B and 5A through 5C, the field portion 332 may include a conducting wire shaped like a horizontally symmetrical square, hexagonal, octagonal or circular loop, or shaped like a loop having a combination of the above shapes.

Figure 6A:
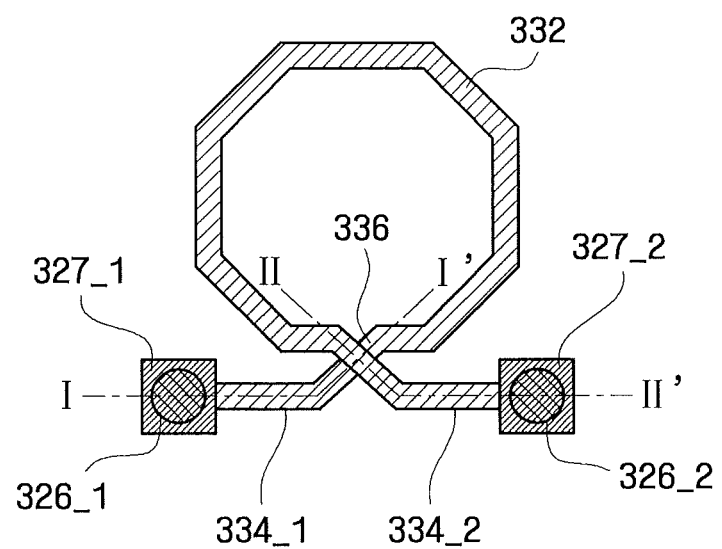
FIGS. 6A through 6H are plan and cross-sectional views showing other shapes of the inductors shown in FIGS. 4A though 4E according to exemplary embodiments of the present inventive concepts.
Figure 6B:
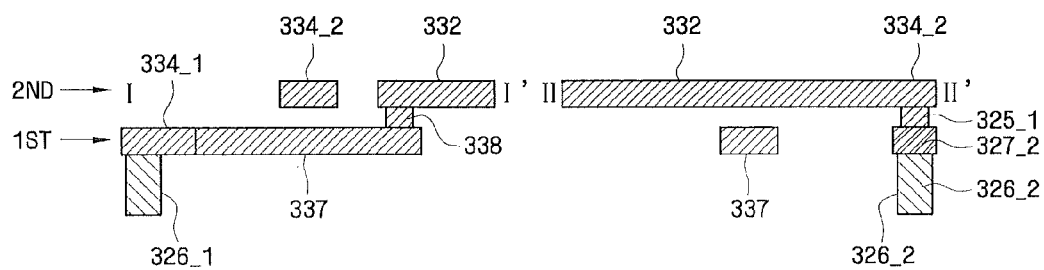
Figure 6C:
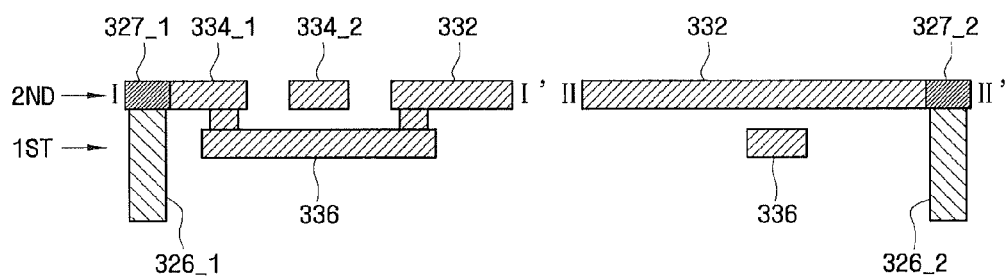
Figure 6D:
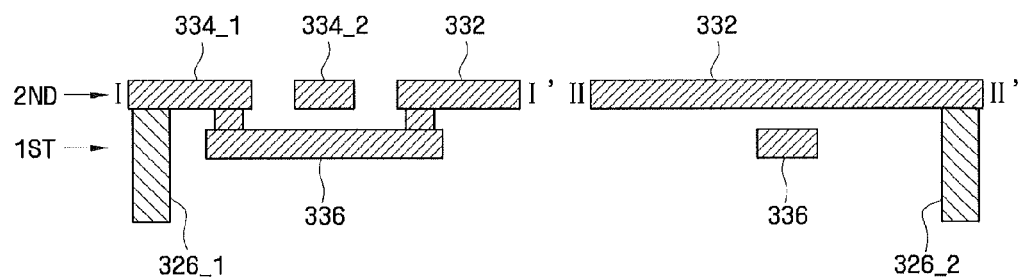

FIGS. 6A through 6D are plan and cross-sectional views showing embodiments of other shapes of inductor 331 of FIG. 4A. FIGS. 6B through 6D are cross-sectional views taken along the lines I-I' and II-II' of FIG. 6A.

Referring to FIGS. 4A and 6A, the inductor 331 may further include a connection portion 336. The connecting portion 336 may include a horizontal connection portion which is disposed at a different level from the field portion 332 and/or a vertical connection portion which connects the field portion 332 to the lead portions 334 in a vertical direction. The connection portion 336 connects the field portion 332 to the lead portions 334 or connects one part of the field portion 332 to another part of the field portion 332, thereby making the open loop-shaped field portion 332 into a closed loop-shape.

Referring to FIGS. 4A, 6A and 6B, the inductor 331 may include the field portion 332, the first and second lead portions 334_1 and 334_2 which are connected respectively to the first and second through electrodes 326_1 and 326_2, and horizontal and vertical connection portions 337 and 338 which connect the first lead portion 334_1 and the field portion 332. The horizontal connection portion 337 may intersect the second lead portion 334_2. The horizontal connection portion 337 and the second lead portion 334_2 may be separated from each other and may be disposed at different levels. For example, when the inductor 331 is formed as an RDL 325, the RDL 325 may include conductive pattern layers formed on different layers, i.e., a first layer 1ST and a second layer 2ND.

When the field portion 332 of the inductor 331 is disposed on the second layer 2ND, the first lead portion 334_1 may be formed on the first layer 1ST, and the second lead portion 334_2 may be disposed on the second layer 2ND. The first lead portion 334_1 formed on the first layer 1ST may be connected to the field portion 332 on the second layer 2ND by the horizontal and vertical connection portions 337 and 338. An end of the horizontal connection portion 337 may be connected to the field portion 332 by the vertical connection portion 338, and the other end thereof may be connected to the first through electrode 326_1 or the first contact pad 327_1 by the first lead portion 334_1. The second lead portion 334_2 may be connected to the field portion 332 and disposed at the same level as the field portion 332. The second lead portion 334_2 may be connected to the second through electrode 326_2 or the second contact pad 327_2 by a contact via 325_1.

When the first lead portion 334_1 is formed on the second layer 2ND, the first through electrode 326_1, like the second through electrode 326_2, may be connected to the first lead portion 334_1 by a contact via. In a case where current flows from the first through electrode 326_1 to the second through electrode 326_2, it may first flow to the field portion 332 via the first lead portion 334_1 and the connection portion 336. The current flowing to the field portion 332 may then flow to the second through electrode 326_2 via the second lead portion 334_2.

In another example, when the first contact pad 327_1 is formed on the second layer 2ND as in the embodiment of FIG. 6C, it may be connected to the first lead portion 334_1 which is disposed on the second layer 2ND. In yet another example, the first through electrode 326_1 may be directly connected to the first lead portion 334_1 without using the first contact pad 327_1, as shown in FIG. 6D. The first through electrode 326_1 may extend to the second layer 2ND to be directly connected to the first lead portion 334_1 which is disposed on the second layer 2ND.

When the inductor 331 is shaped as an open loop as shown in FIGS. 4B and 4E, no conducting wire exists in the open area 333. As a result of the open loop, a weak magnetic field may be generated, thereby reducing the inductance of the inductor 331. According to the current exemplary embodiment, however, since the horizontal connection portion 337 and the second lead portion 334_2 intersect each other, the inductor 331 may have a closed loop structure as seen in the plane. Therefore, transmission efficiency can be improved without a reduction in the inductance of the inductor 331.

Figure 6E:
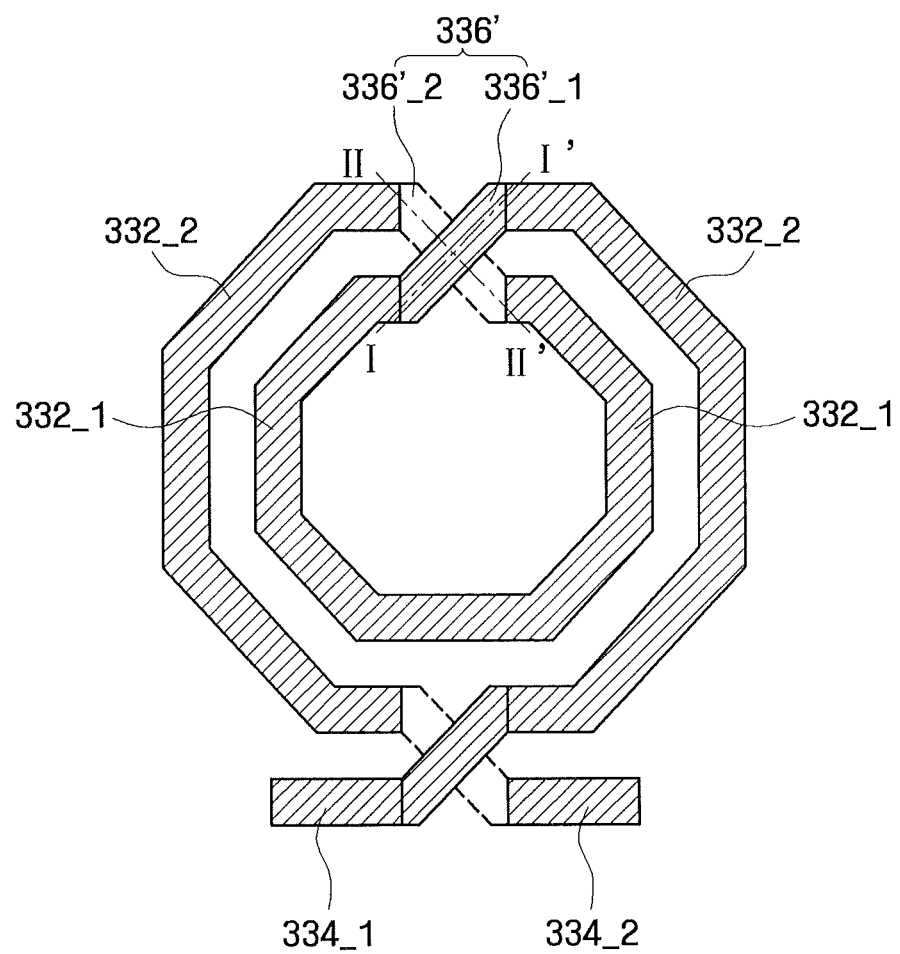

Referring to FIG. 6E, the field portion 332 may include a plurality of loop-shaped conducting wires 332_1 and 332_2. Since a greater number of windings of conducting wire increases inductance, the formation of the plurality of loop-shaped conducting wires 332_1 and 332_2 may improve transmission efficiency. The loop-shaped conducting wires 332_1 and 332_2 may be disposed in the same plane, and the inner loop-shaped conducting wire 332_1 may be connected to the outer loop-shaped conducting wire 332_2 by a connection portion 336'. The connection portion 336' may include a first connection portion 336'_1 and a second connection portion 336'_2. The first connection portion 336'_1 connects the inner loop-shaped conducting wire 332_1 and the outer loop-shaped conducting wire 332_2 and is disposed at the same level as the inner loop-shaped conducting wire 332_1 and the outer loop-shaped conducting wire 332_2, and the second connection portion 336'_2 connects the inner loop-shaped conducting wire 332_1 and the outer loop-shaped conducting wire 332_2 and is disposed at a different level from the inner loop-shaped conducting wire 332_1 and the outer loop-shaped conducting wire 332_2.

Figure 6F:
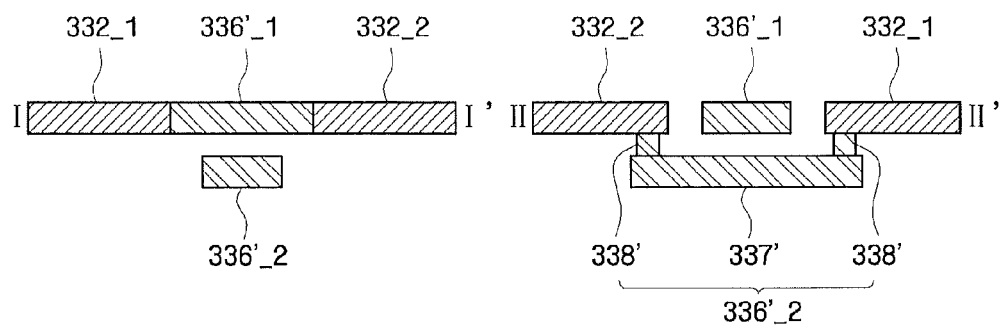

FIG. 6F is a cross-sectional view taken along the lines I-I' and II-II' of FIG. 6E. Referring to FIGS. 6E and 6F, the second connection portion 336'_2 may include a horizontal connection portion 337' which is formed at a different level from the loop-shaped conducting wires 332_1 and 332_2 and vertical connection portions 338' which connect the horizontal connection portion 337' to the loop-shaped conducting wires 332_1 and 332_2 in a vertical direction. In another example, cross sections of the inductor 331 taken along the lines I-I' and II-II' of FIG. 6E may be similar to FIGS. 6C and 6D.

Figure 6G:
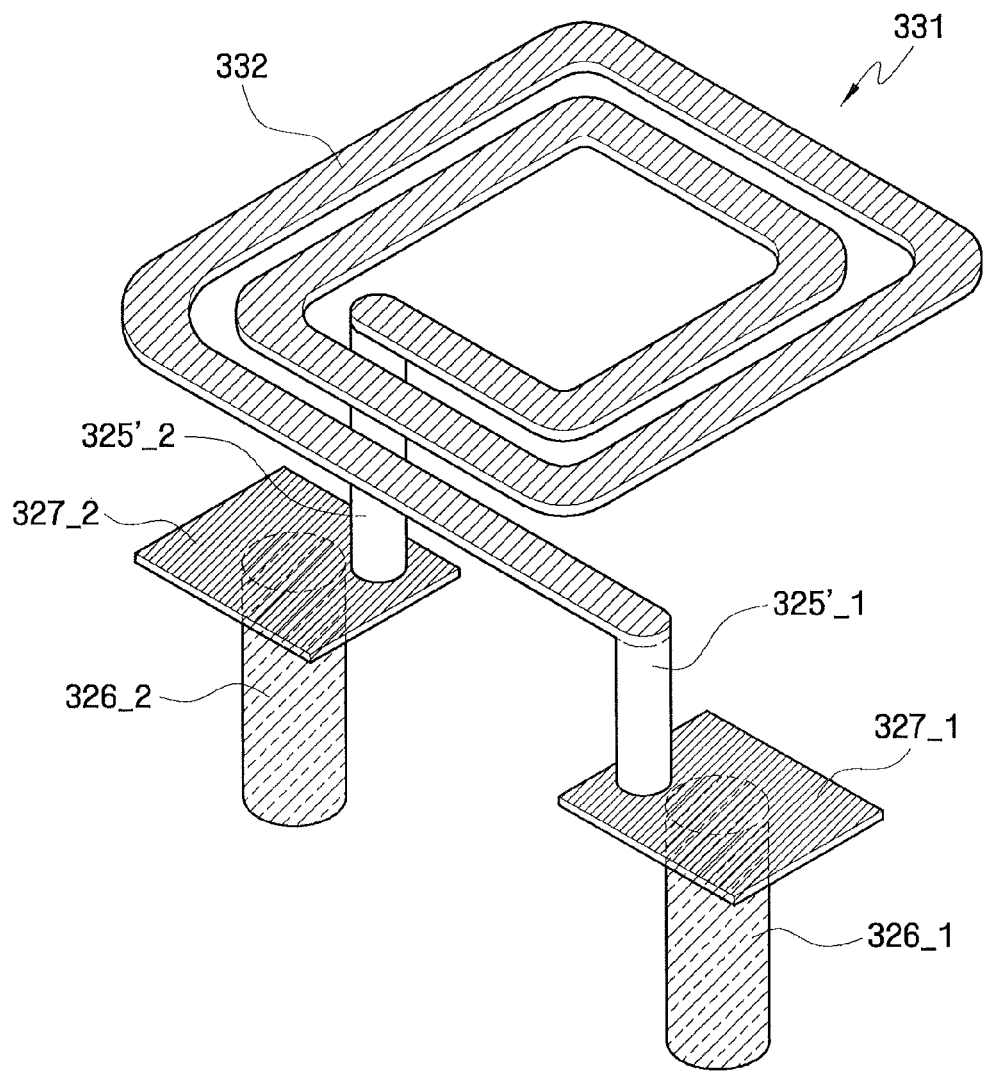
Figure 6H:
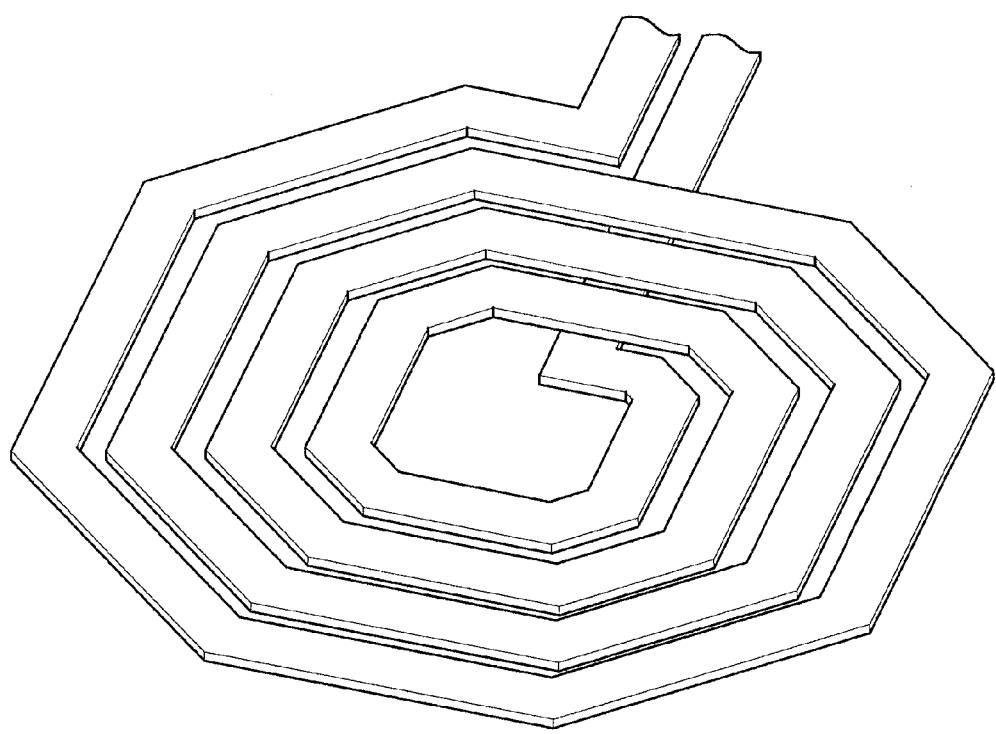

Referring to FIG. 6G, the field portion 332 of the inductor 331 may include a spiral conducting wire. For example, when all parts of the spiral field portion 332 are formed at the same level and when the contact pads 327_1 and 327_2 are formed at a different level from the field portion 332 as in the embodiment of FIG. 6G, the inductor 331 may further include a connection portion which connects the field portion 332 to the contact pads 327_1 and 327_2. For example, the field portion 332 may be connected to the contact pads 327_1 and 327_2 by contact vias 325'_1 and 325'_2, respectively.

Referring to FIGS. 2B through 6H, each of the second coupling conductive patterns 350 of the transceiver 340 may include a second inductor having the same or a similar shape as the inductor 331 of the first coupling conductive patterns 330. The second coupling conductive patterns 350 may face the first coupling conductive patterns 330 and may be aligned in a vertical direction. A magnetic field generated when current flows through the first coupling conductive patterns 330 may induce a magnetic field in the second coupling conductive patterns 350, thereby causing current to flow through the second coupling conductive patterns 350.

The shape of the first and second coupling conductive patterns 330 and 350 is not limited to the above examples. The shape of the first and second coupling conductive patterns 330 and 350 may vary according to the type of a signal and/or power transmitted through the first and second coupling conductive patterns 330 and 350, frequency, and the like.

Figure 7A:
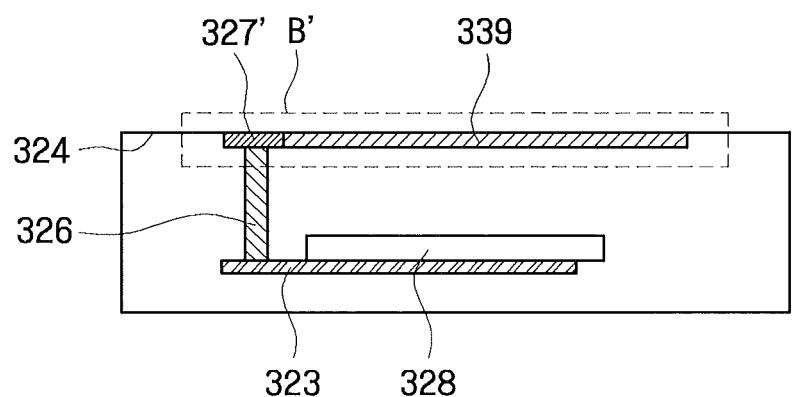
FIGS. 7A and 7B are views of the portion A of FIG. 2B according to another exemplary embodiment of the present inventive concepts.
Figure 7B:
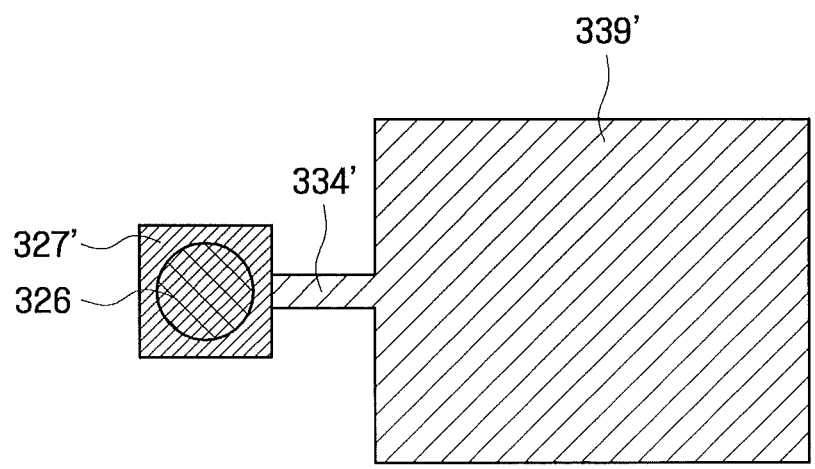

FIG. 7A is an cross section view of the portion A of FIG. 2B according to another exemplary embodiment of the present invention. FIG. 7B is a plan view of a portion B' of FIG. 7A.

Referring to FIGS. 2B, 7A and 7B, the portion A of the semiconductor chip 320 may be configured as in FIG. 7A. For example, each of the first coupling conductive patterns 330 may include a first capacitor 339. The first capacitor 339 may include a plate-shaped capacitor electrode 339' and a lead portion 334' which is connected to the capacitor electrode 339'. An end of the lead portion 334' may be connected to the capacitor electrode 339', and the other end thereof may be connected to a corresponding one of the through electrodes 326 or a contact pad 327' which is connected to the corresponding one of the through electrodes 326. The corresponding one of the through electrodes 326 may connect a corresponding one of the circuit portions 328 of the semiconductor chip 320 to the first capacitor 339.

Each of the second coupling conductive patterns 350 of the transceiver 340 may include a second capacitor which has the same or similar structure as the first capacitor 339. The second capacitor may face the first capacitor 339 and may be aligned in a vertical direction. Thus, the second capacitor may exchange signals with the first capacitor 339 in a capacitive coupling manner.

Figure 8A:
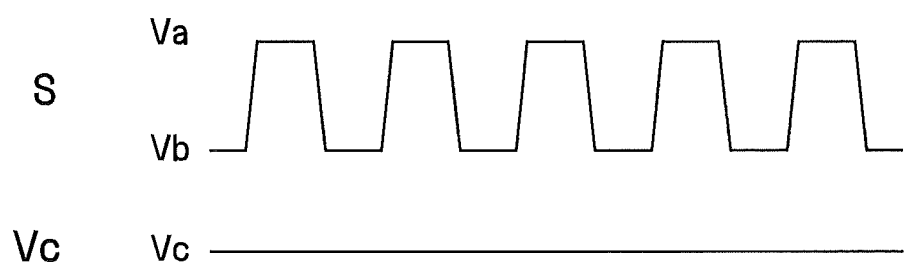
FIGS. 8A and 8B are timing and partial plan diagrams illustrating a method of operating a semiconductor device according to another exemplary embodiment of the present inventive concepts.

FIG. 8A is a diagram illustrating a method of operating a semiconductor device according to an exemplary embodiment of the present invention.

Referring to FIGS. 4A, 4B, and 8A, each of the first coupling conductive patterns 330 (see FIG. 2B) may include the inductor 331. A signal S may be transmitted to the first lead portion 334_1 and/or the second lead portion 334_2 of the inductor 331, and a fixed voltage Vc may be applied to the other one. Examples of the signal S may include data, a control signal, an address, and/or a clock. The signal S may swing between a first voltage Va and a second voltage Vb, and any one of the first voltage Va and the second voltage Vb may have the same level as the fixed voltage Vc. The fixed voltage Vc may be a reference voltage used to identify the signal S that is received. The fixed voltage Vc may be a ground voltage Vss or a power supply voltage Vdd.

Figure 8B:
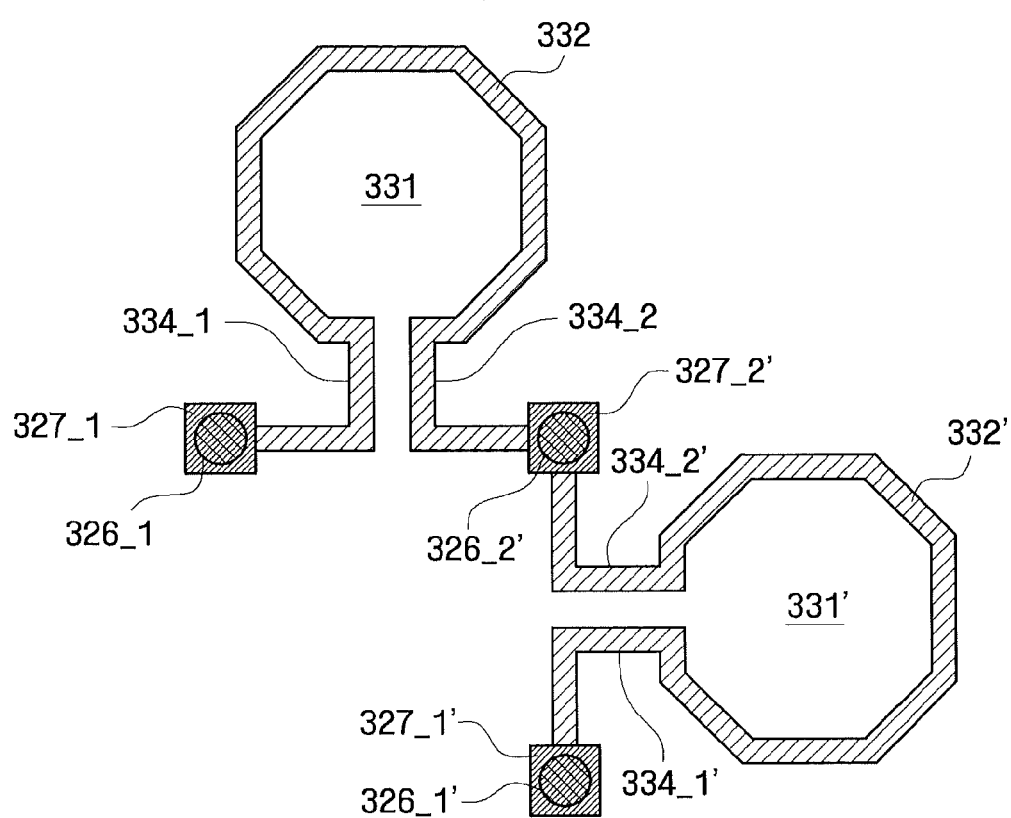

Referring to FIG. 8B, when the semiconductor chip 320 includes a plurality of inductors, e.g., first and second inductors 331 and 331' which may share a second through electrode 326_2' to which the fixed voltage Vc is applied. The fixed voltage Vc may be applied to one through electrode, i.e., the second through electrode 326_2', and second lead portions 334_2 and 334_2' of the first and second inductors 331 and 331' may be connected to the second through electrode 326_2' to which the fixed voltage Vc is applied or a contact pad 327_2' which is formed on the second through electrode 326_2'. For example, the signal S may be transmitted to a first through electrode 326_1 and a first lead portion 334_1 of the first inductor 331, and the fixed voltage Vc may be applied to the second through electrode 326_2' and the second lead portion 334_2.

The first voltage Va and the fixed voltage Vc may be the power supply voltage Vdd. The second voltage Vb may have a lower level than the first voltage Va. Therefore, no current may flow through the first inductor 331 while the first voltage Va is applied to the first lead portion 334_1 of the first inductor 331. On the other hand, current may flow through the first inductor 331 while the second voltage Vb is applied to the first lead portion 334_1 of the first inductor 331, thereby generating a magnetic field. The signal S may be formed by setting the first voltage Va correspond to a first logic level, and the second voltage Vb may be made to correspond to a second logic level.

Another signal may be transmitted to a first lead portion 334_1' of the second inductor 331' which shares the second through electrode 326_2' with the first inductor 331. According to the current exemplary embodiment, since the first and second inductors 331 and 331' share the second through electrode 326_2' to which the fixed voltage Vc is applied, the number of through electrodes can be reduced. Therefore, the degree of freedom for the placement of through electrodes can be increased, and the size of the semiconductor device can be reduced.

Figure 9:
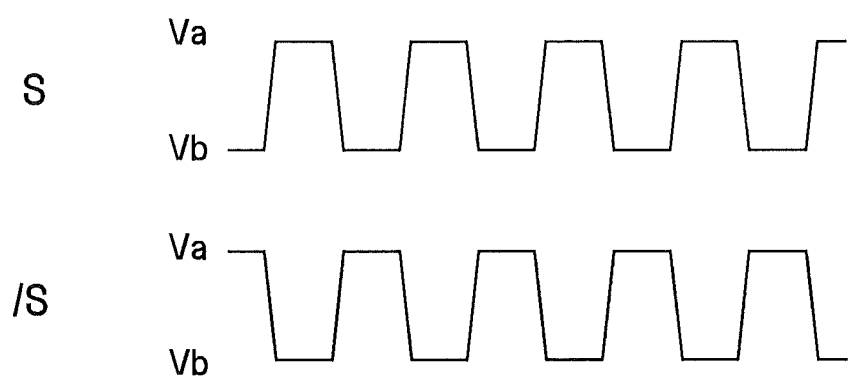
FIG. 9 is a timing diagram illustrating a method of operating a semiconductor device according to another exemplary embodiment of the present inventive concepts.

FIG. 9 is a diagram illustrating a method of operating a semiconductor device according to another exemplary embodiment of the present invention.

Referring to FIGS. 4A, 4B, and 9, a first signal S is supplied to any one of the first lead portion 334_1 and the second lead portion 334_2, and a second signal /S is supplied to the other one. The first signal S may include a first voltage Va and a second voltage Vb. The second voltage Vb may have a lower level than the first voltage Va. The second signal /S may include a first voltage Va and a second voltage Vb and may have an opposite phase to that of the first signal S. For example, the first signal S may be supplied to the first through electrode 326_1 and the first lead portion 334_1, and the second signal /S may be supplied to the second through electrode 326_2 and the second lead portion 334_2. While the first voltage Va of the first signal S is applied to the first lead portion 334_1, the second voltage Vb of the second signal /S may be applied to the second lead portion 334_2. Therefore, current may flow from the first lead portion 334_1 to the second lead portion 334_2 via the field portion 332. On the contrary, while the second voltage Vb of the first signal S is applied to the first lead portion 334_1, the first voltage Va of the second signal /S may be applied to the second lead portion 334_2. Therefore, current may flow from the second lead portion 334_2 to the first lead portion 334_1 via the field portion 332. Delivering signals where current flows from the first lead portion 334_1 to the second lead portion 334_2 may be performed by setting the first lead portion to correspond to a first selected logic level, and an alternative signal where current flows from the second lead portion 334_2 to the first lead portion 334_1 may be performed by setting the second lead portion to correspond to a second selected logic level.

Figure 10A:
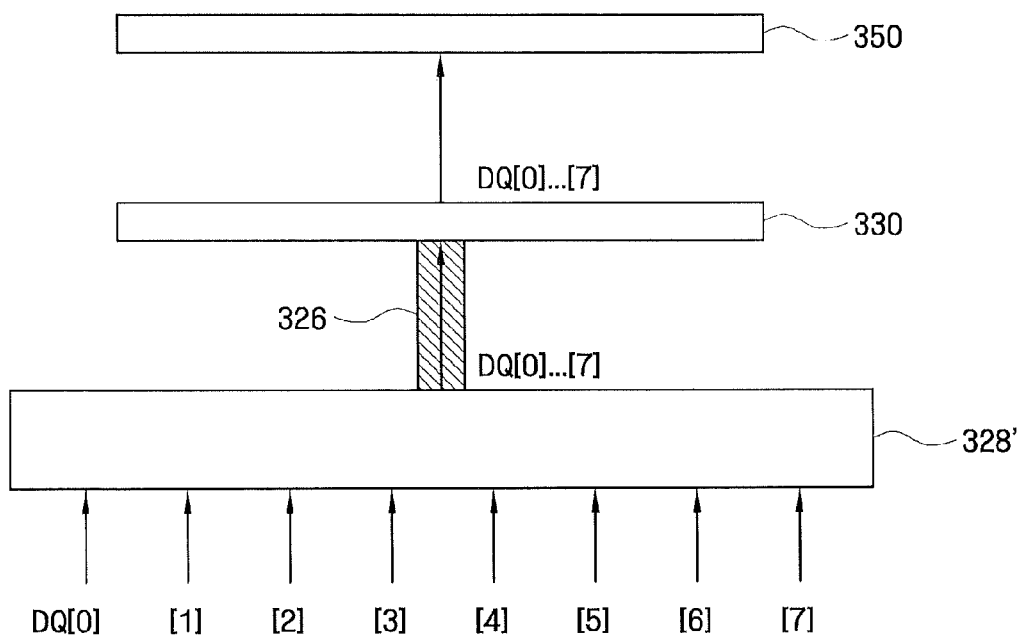
FIGS. 10A and 10B illustrate a method of operating a semiconductor device according to another exemplary embodiment of the present inventive concepts.
Figure 10B:
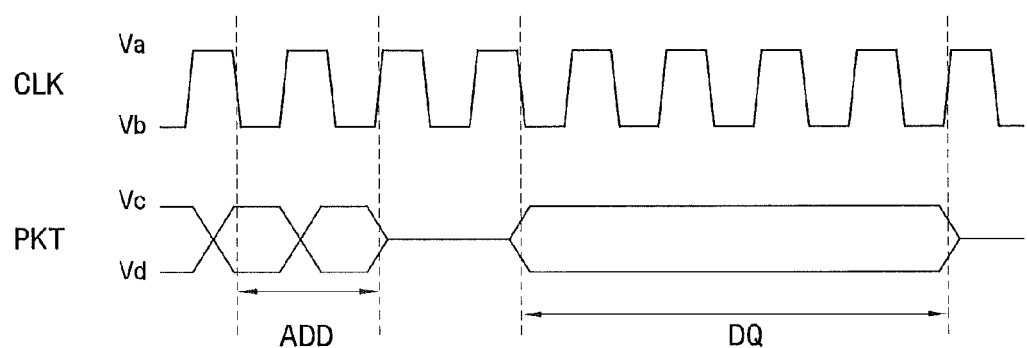

FIGS. 10A and 10B are diagrams illustrating a method of operating a semiconductor device according to another exemplary embodiment of the present invention. According to the exemplary embodiment, the semiconductor device may transmit or receive signals by using time division multiplexing. Referring to FIGS. 2B and 10A, signals may be transmitted from the first coupling conductive patterns 330 to the second coupling conductive patterns 350 by using time division multiplexing. A plurality of temporally divided signals may be delivered to one coupling conductive pattern. For example, when the semiconductor chip 320 and the transceiver 340 exchange data signals DQ[0] through DQ[7] on an 8 bit-by-8 bit basis, the 8-bit data signals DQ[0] through DQ[7] may be serialized by a buffer 328' of the semiconductor chip 320, and successively transmitted to the second coupling conductive pattern 350 via a corresponding one of the through electrodes 326 and a corresponding one of the first coupling conductive patterns 330. Signals serialized by the buffer 328' may not necessarily all be the same type of signals. For example, an address and data may be serialized using time division multiplexing and successively transmitted to the second coupling conductive patterns 350.

Referring to FIG. 10B, a plurality of signals may be temporally divided into packet signals PKT and successively transmitted. The packet signals PKT may include different types of signals. For example, the packet signals PKT may include an address ADD and data DQ. The packet signals PKT may be synchronized with a clock CLK and may be transmitted accordingly.

According to the current exemplary embodiment, one through electrode and one coupling conductive pattern are not formed for each signal. Instead, a plurality of signals can be transmitted using one through electrode and one coupling conductive pattern. Thus, the number of through electrodes can be reduced, thereby reducing the size of the semiconductor device and increasing the degree of freedom for placement design.

Figure 11:
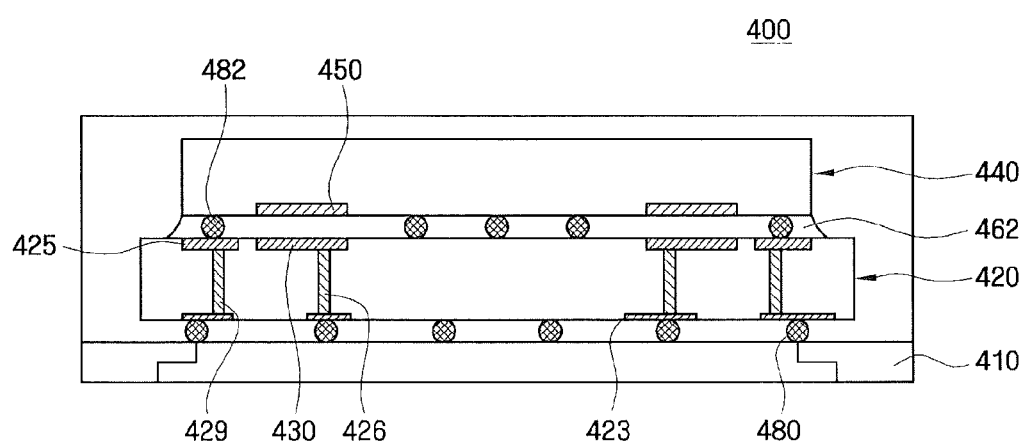
FIGS. 11 through 18 are views of semiconductor devices according to another exemplary embodiments of the present inventive concepts.

FIG. 11 is a cross-sectional view of a semiconductor device 400 according to another exemplary embodiment of the present inventive concept. The following description will focus on differences from the semiconductor device 300 of the embodiment of FIG. 2B.

Referring to FIG. 11, the semiconductor device 400 according to the current exemplary embodiment may further include conductive media 482 which are disposed between a first semiconductor chip 420 and a transceiver 440. Examples of the conductive media 482 may include conductive bumps, micro solder bumps, and solder balls. The conductive media 482 may be located in areas where first coupling conductive patterns 430 are not disposed. The first semiconductor chip 420 may be electrically and/or physically connected to the transceiver 440 by the conductive media 482.

The transceiver 440 may be a second semiconductor chip having second coupling conductive patterns 450. The first semiconductor chip 420 may include first through electrodes 426 which are electrically connected to the first coupling conductive patterns 430 and third through electrodes 429 which are connected to the conductive media 482. The third through electrodes 429 may be connected to the conductive media 482 by wiring patterns 425.

Signals and/or power needed to operate the second semiconductor chip, i.e., the transceiver 440, may be delivered to the second semiconductor chip via the first through electrodes 426 and/or the third through electrodes 429. For example, signals may be delivered from the first semiconductor chip 420 to the second semiconductor chip (i.e., the transceiver 440) via the first through electrodes 426 and the first coupling conductive patterns 430, and power may be delivered from a package substrate 410 to the second semiconductor chip via the third through electrodes 429 and the conductive media 482. The third through electrode 429 may be electrically insulated from the first semiconductor chip 420. The third through electrodes 429 may be connected to the package substrate 410 by conductive media 480 which are disposed between wiring patterns 423 and the first semiconductor chip 420 and the package substrate 410.

A protective material 462 which covers at least part of the conductive media 482 may further be formed between the first semiconductor chip 420 and the transceiver 440. The protective material 462 may contain an epoxy material and/or an underfill material.

According to the current exemplary embodiment, signals are transmitted using wireless communication mediums such as the first and second coupling conductive patterns 430 and 450. Thus, high-speed signal transmission is possible. In addition, power is transmitted using wired communication mediums such as the conductive media 482. Thus, power loss during power transmission can be reduced. Since signals and power are transmitted using separate mediums as described above, transmission characteristics of the semiconductor device 400 can be improved.

Figure 12:
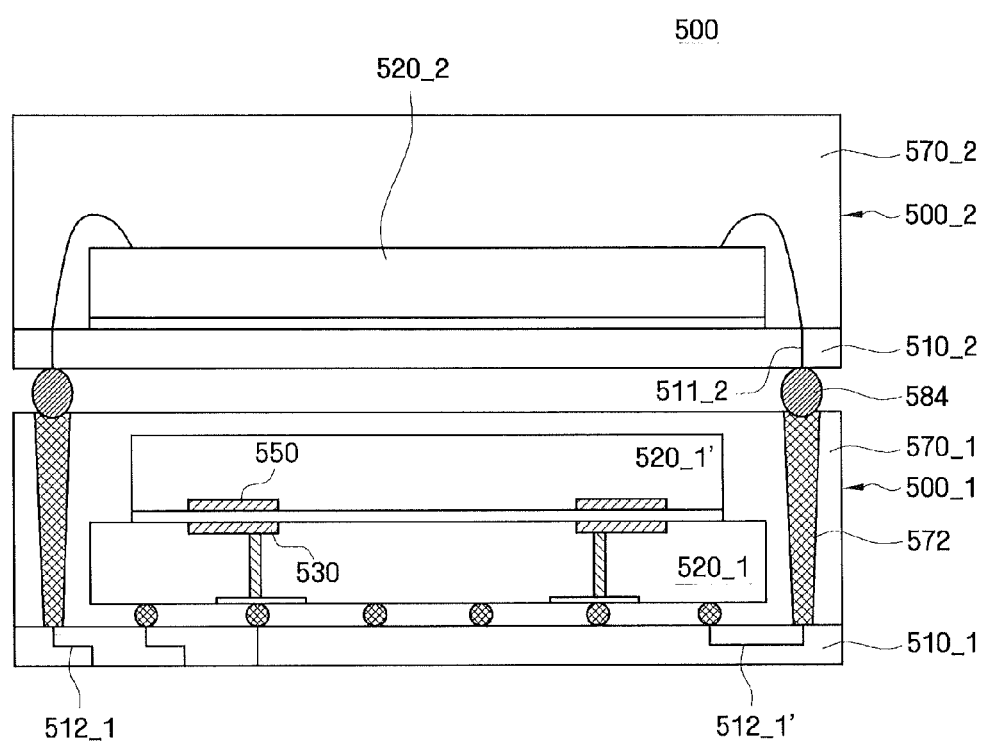

FIG. 12 is a cross-sectional view of a semiconductor device 500 according to another exemplary embodiment of the present invention.

Referring to FIG. 12, the semiconductor device 500 according to the current exemplary embodiment may include a stack of two or more semiconductor packages. For example, the semiconductor device 500 may include a first semiconductor package 500_1 and a second semiconductor package 500_2 which is stacked on the first semiconductor package 500_1.

The first semiconductor package 500_1 may include a first semiconductor chip 520_1 and a transceiver 520_1'. The first semiconductor chip 520_1 and the transceiver 520_1' may respectively be any one of the semiconductor chips and any one of the transceivers described above with reference to FIGS. 2A through 11. The first semiconductor chip 520_1 may include first coupling conductive patterns 530, and the transceiver 520_1' may include second coupling conductive patterns 550 which communicate wirelessly with the first coupling conductive patterns 530.

The first semiconductor package 500_1 may further include a first protective material 570_1 which at least partially covers the first semiconductor chip 520_1 and the transceiver 520_1' and molding through electrodes 572 which penetrate the first protective material 570_1. The molding through electrodes 572 may penetrate at least part of the first protective material 570_1 and connect a first package substrate 510_1 to the second semiconductor package 500_2. Each of the molding through electrodes 572 may be tapered. That is, a diameter of each of the molding through electrodes 572 may be reduced toward the first package substrate 510_1. The molding through electrodes 572 may be connected to the outside of the first semiconductor package 500_1 or the first semiconductor chip 520_1 by circuit patterns 512_1 and 512_1'.

The semiconductor device 500 may further include conductive media 584 which are disposed between the first semiconductor package 500_1 and the second semiconductor package 500_2. The molding through electrodes 572 may be connected to the second semiconductor package 500_2 by the conductive media 584.

The second semiconductor package 5002 may include a second package substrate 510_2, a second semiconductor chip 520_2 which is mounted on the second package substrate 510_2, and a second protective material 570_2 which at least partially covers the second package substrate 510_2 and the second semiconductor chip 520_2. The second semiconductor chip 520_2 may be connected to the second package substrate 510_2 by using a wire-bonding or flip-chip method. In another example, the second semiconductor package 500_2 may include a wafer-level package. Alternatively, the second semiconductor package 500_2 may include a plurality of semiconductor chips which communicate wirelessly with each other. The type of the second semiconductor package 500_2 is not limited to the above-described types and may vary.

According to the current exemplary embodiment, no conductive media are formed between the first semiconductor chip 520_1 and the second semiconductor chip 520_2. Thus, the height of the first semiconductor package 500_1 can be reduced. The reduced height of the first semiconductor package 500_1 makes it easier to perform the process of removing the first protective material 570_1 so as to form the molding through electrodes 572. This can reduce connection defects of the molding through electrodes 572 caused by process defects. In addition, if an aspect ratio is constant, since the height of the molding through electrodes 572 is reduced in the process of removing the first protective material 570_1, the diameter of the molding through electrodes 572 may also be reduced. Accordingly, the total size of the first semiconductor package 500_1 can be reduced.

Figure 13:
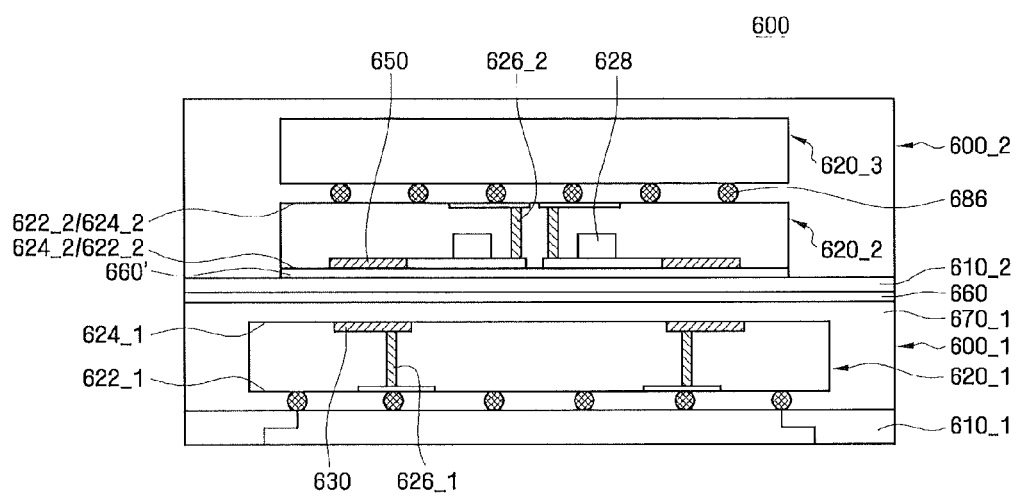

FIG. 13 is a cross-sectional view of a semiconductor device 600 according to another exemplary embodiment of the present invention. Referring to FIG. 13, the semiconductor device 600 according to the current exemplary embodiment may include a stack of two or more semiconductor packages. For example, the semiconductor device 600 may include a first semiconductor package 600_1 and a second semiconductor package 600_2 which is stacked on the first semiconductor package 600_1.

The first semiconductor package 600_1 may include a first package substrate 610_1 and a first semiconductor chip 620_1 which is mounted on the first package substrate 610_1. The first semiconductor chip 620_1 may include first through electrodes 626_1 which penetrate at least part of the first semiconductor chip 620_1 and first coupling conductive patterns 630 which are connected to the first through electrodes 626_1. The first coupling conductive patterns 630 may be disposed on a surface of the first semiconductor chip 620_1 which is opposite the first package substrate 610_1. In other words, the first coupling conductive patterns 630 may be placed to face second coupling conductive patterns 650. For example, when the first semiconductor chip 620_1 is mounted on the first package substrate 610_1 in a flip-chip manner such that a first surface 622_1 of the first semiconductor chip 620_1 faces the first package substrate 610_1, the first coupling conductive patterns 630 may be formed on a second surface 624_1 of the first semiconductor chip 620_1. The first semiconductor package 600_1 may further include a first protective material 670_1 which at least partially covers the first package substrate 610_1 and the first semiconductor chip 620_1. The first protective material 670_1 may cover or expose the first coupling conductive patterns 630.

The second semiconductor package 600_2 may include a second package substrate 610_2 and a second semiconductor chip 620_2 which is mounted on the second package substrate 610_2. The second semiconductor chip 620_2 may be fixed to the second package substrate 610_2 by an adhesive layer 660' or conductive media. The second semiconductor chip 620_2 may include the second coupling conductive patterns 650 which are disposed on its surface that faces the first semiconductor package 600_1. For example, when a first surface 622_2 of the second semiconductor chip 620_2 faces the first semiconductor package 600_1, the second coupling conductive patterns 650 may be formed on the first surface 622_2 of the second semiconductor chip 620_2. In another example, when a second surface 624_2 of the second semiconductor chip 620_2 faces the first semiconductor package 600_1, the second coupling conductive patterns 650 may be formed on the second surface 624_2 of the second semiconductor chip 620_2. The second coupling conductive patterns 650 may be placed to face the first coupling conductive patterns 630 of the first semiconductor chip 620_1 and may be aligned in a vertical direction.

The second semiconductor chip 620_2 may further include second through electrodes 626_2. For example, when the second coupling conductive patterns 650 are formed on the second surface 624_2 of the second semiconductor chip 620_2, they may be electrically connected to circuit portions (not shown), which are formed on the first surface 622_2, by the second through electrodes 626_2. Accordingly, signals transmitted or received through the second coupling conductive patterns 650 may be delivered to the circuit portions through the second through electrodes 626_2.

The second semiconductor package 600_2 may further include a third semiconductor chip 620_3 which is stacked on the semiconductor chip 620_2. The third semiconductor chip 620_3 may be stacked on the second semiconductor chip 620_2 such that a first or second surface of the third semiconductor chip 620_3 faces the second semiconductor chip 620_2. The second semiconductor chip 620_2 may be connected to the third semiconductor chip 620_3 by the second through electrodes 626_2. For example, the second through electrodes 626_2 may be connected to the second coupling conductive patterns 650 so as to deliver signals and/or power, which are transmitted or received through the second coupling conductive patterns 650, to the third semiconductor chip 620_3. In another example, when the third semiconductor chip 620_3 is stacked on the second surface 624_2 of the second semiconductor chip 620_2, the second through electrodes 626_2 may be connected to the circuit portions (not shown) of the second semiconductor chip 620_2 so as to deliver signals from the second semiconductor chip 620_2 to the third semiconductor chip 620_3.

Conductive media 686 may be disposed between the second semiconductor chip 620_2 and the third semiconductor chip 620_3. The second semiconductor chip 620_2 and the third semiconductor chip 620_3 may be connected to each other by the conductive media 686. For example, when the third semiconductor chip 620_3 faces the second surface 624_2 of the second semiconductor chip 620_2, the conductive media 686 may be electrically connected to the second through electrodes 626_2. In another example, when the third semiconductor chip 620_3 faces the first surface 622_2 of the second semiconductor chip 620_2, the conductive media 686 may be electrically connected to circuit portions 628.

The second package substrate 610_2 may be a support substrate which supports the second semiconductor chip 620_2. The second package substrate 610_2 may not have conductive patterns at least in its areas which overlap the first and second coupling conductive patterns 630 and 650. Examples of the second package substrate 610_2 may include polyimide, silicon, and glass substrates. The second package substrate 610_2 is not limited to the above-described substrates. Any type of substrate can be used as long as it does not interfere wireless communication between the first and second coupling conductive patterns 630 and 650.

The semiconductor device 600 according to the current exemplary embodiment may further include an adhesive layer 660 between the first semiconductor package 600_1 and the second semiconductor package 600_2. The second semiconductor package 600_2 may be fixed onto the first semiconductor package 600_1 by the adhesive layer 660.

According to the current exemplary embodiment, a stack of the first and second semiconductor packages 600_1 and 600_2 included in the semiconductor package 600 can be physically and electrically connected to each other without conductive media between the first and second semiconductor packages 600_1 and 600_2. The absence of the conductive media can reduce the total height of the semiconductor package (i.e., device 600) and eliminate connection defects between the first and second semiconductor packages 600_1 and 600_2 which result from contact defects of the conductive media due to warpage and/or misalignment.

Figure 14:
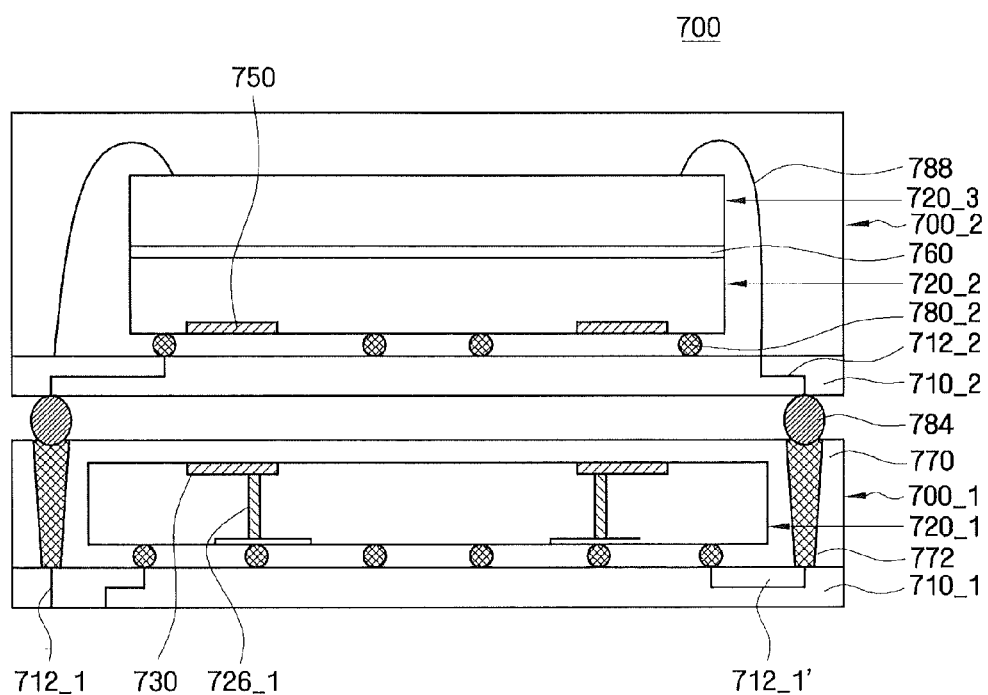

FIG. 14 is a cross-sectional view of a semiconductor device 700 according to another exemplary embodiment of the present invention. The following description will focus on differences from the semiconductor device 600 according to the embodiment of FIG. 13.

Referring to FIG. 14, a second package substrate 710_2 may include circuit patterns 712_2. The second package substrate 710_2 may be, for example, a printed circuit board (PCB). A second semiconductor package 700_2 may further include conductive media 780_2 between a second semiconductor chip 720_2 and the second package substrate 710_2. Examples of the conductive media 780_2 may include flip-chip bumps. The circuit patterns 712_2 and the conductive media 780_2 may be disposed in areas which do not overlap first and second coupling conductive patterns 730 and 750.

A third semiconductor chip 720_3 may be stacked on the second semiconductor chip 720_2. For example, the third semiconductor chip 720_3 may be fixed onto the second semiconductor chip 720_2 by an adhesive layer 760 which is interposed between the second semiconductor chip 720_2 and the third semiconductor chip 720_3. The third semiconductor chip 720_3 may be electrically connected to the second package substrate 710_2 by bonding wires 788. In another example, the third semiconductor chip 720_3 may be connected to the second semiconductor chip 720_2 by conductive media 686 (see FIG. 13) which are interposed between the second semiconductor chip 720_2 and the third semiconductor chip 720_3. In yet another example, the third semiconductor chip 720_3 may be connected to the second semiconductor chip 720_2 by through electrodes 626_2 which are formed in the second semiconductor chip 720_2 as shown in FIG. 13.

A first semiconductor package 700_1 may further include molding through electrodes 772 which may penetrate at least part of the first protective material 770 and connect a first package substrate 710_1 and the second package substrate 710_2. The molding through electrodes 772 may be electrically connected to the outside of the first semiconductor package 700_1 or a first semiconductor chip 720_1 by circuit patterns 712_1 and 712_1' of the first package substrate 710_1. The semiconductor device 700 may further include conductive media 784 which are disposed between the first semiconductor package 700_1 and the second semiconductor package 700_2. The molding through electrodes 772 may be connected to the circuit patterns 712_2 by the conductive media 784.

Signals and/or power needed to operate the second semiconductor package 700_2 may be delivered to the second semiconductor package 700_2 via the first and second coupling conductive patterns 730 and 750 and/or the molding through electrodes 772. For example, signals needed to operate the second semiconductor chip 720_2 may be wirelessly exchanged between the first semiconductor chip 720_1 and the second semiconductor chip 720_2 through the first and second coupling conductive patterns 730 and 750. Power needed to operate the second semiconductor chip 720_2 may be delivered from the first package substrate 710_1 to the second package substrate 710_2 through the molding through electrodes 772. In another example, signals and power needed to operate the second semiconductor package 700_2 may be delivered from the first package substrate 710_1 to the second package substrate 710_2 through the molding through electrodes 772. The signals and power delivered to the second package substrate 710_2 may then be delivered to the second semiconductor chip 720_2 and/or the third semiconductor chip 720_3 through the conductive media 780_2 and/or the bonding wires 788.

According to the current exemplary embodiment, signals are wirelessly exchanged through the first and second coupling conductive patterns 730 and 750. Power may be delivered through the molding through electrodes 772 and the conductive media 784, thereby reducing power loss. Furthermore, since signals are wirelessly delivered, the number of the molding through electrodes 772 and the number of the conductive media 784 can be reduced, which, in turn, reduces the size of the semiconductor device 700.

Figure 15A:
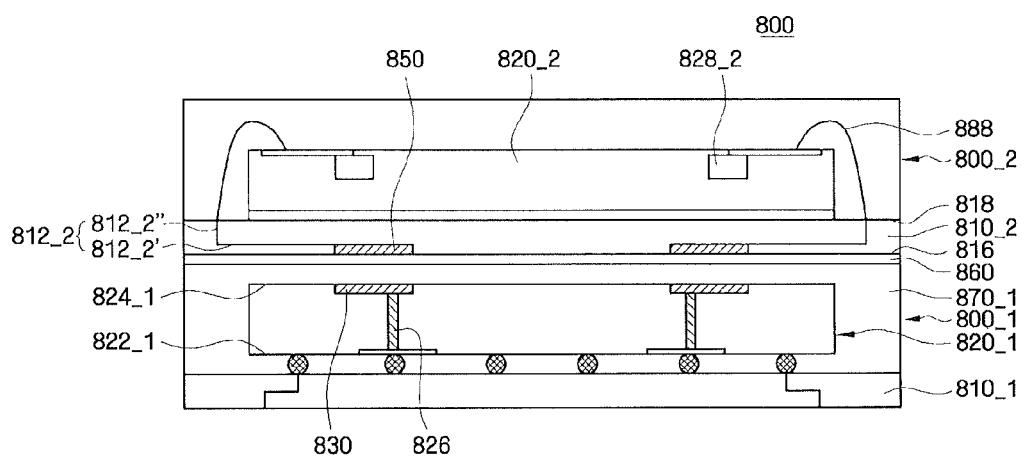
Figure 15B:
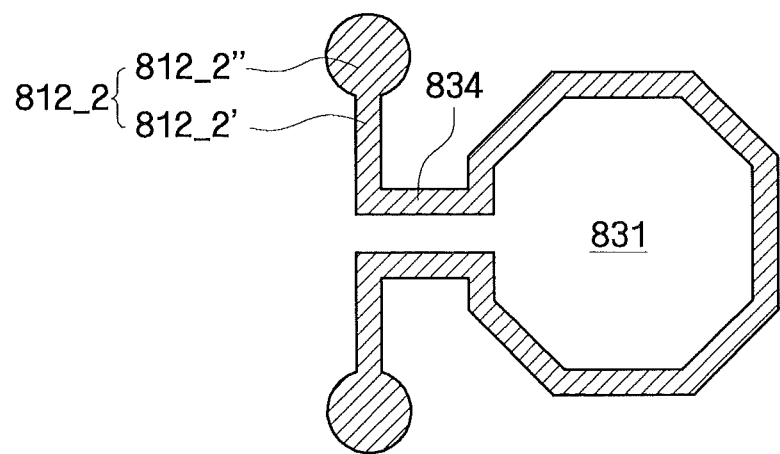

FIGS. 15A and 15B are cross-sectional and partial plan views of a semiconductor device 800 according to another exemplary embodiment of the present invention. According to the current exemplary embodiment, a first and a second semiconductor chip 820_1 and 820_2 included in different semiconductor packages 800_1 and 800_2 can communicate wirelessly with each other.

Referring to FIG. 15A, the semiconductor device 800 may include a stack of two or more semiconductor packages. For example, the semiconductor device 800 may include the first semiconductor package 800_1 and the second semiconductor package 800_2 which is stacked on the first semiconductor package 800_1.

The first semiconductor package 800_1 may include a first package substrate 810_1 and a first semiconductor chip 820_1 which is mounted on the first package substrate 810_1. The first semiconductor chip 820_1 may include through electrodes 826 which penetrate at least part of the first semiconductor chip 820_1 and first coupling conductive patterns 830 which are connected to the through electrodes 826. The first coupling conductive patterns 830 may be disposed on a surface of the first semiconductor chip 820_1 which is opposite the first package substrate 810_1. For example, when the first semiconductor chip 820_1 is mounted on the first package substrate 810_1 in a flip-chip manner such that a first surface 822_1 of the first semiconductor chip 820_1 faces the first package substrate 810_1, the first coupling conductive patterns 830 may be formed on a second surface 824_1 of the first semiconductor chip 820_1. Circuit portions (not shown), which are formed on the first surface 822_1, may be electrically connected to the first coupling conductive patterns 830, which are formed on the second surface 824_1, by the through electrodes 826.

The first semiconductor package 800_1 may further include a first protective material 870_1 which at least partially covers the first package substrate 810_1 and the first semiconductor chip 820_1. The first protective material 870_1 may cover or expose the first coupling conductive patterns 830.

The second semiconductor package 800_2 may include the second package substrate 810_2 and a second semiconductor chip 820_2 which is mounted on the second package substrate 810_2. The second package substrate 810_2 may include second coupling conductive patterns 850 on its surface that faces the first package substrate 810_1. The second coupling conductive patterns 850 may be formed on a surface of the second package substrate 810_2. For example, when the second package substrate 810_2 includes a first surface 816 which faces the first semiconductor package 800_1 and a second surface 818 which is different from the first surface 816, the second coupling conductive patterns 850 may be formed on the first surface 816. The second coupling conductive patterns 850 may be placed to face the first coupling conductive patterns 830 of the first semiconductor chip 820_1 and may be aligned in a vertical direction.

The second package substrate 810_2 may be a PCB which includes circuit patterns 812_2. Each of the circuit patterns 812_2 may include a wiring pattern 812_2' which is disposed parallel to the second coupling conductive patterns 850 and a contact via 812_2" which is vertically connected to the wiring pattern 812_2'. In another example, when the circuit patterns 812_2 are not formed in areas of the second package substrate 810_2 which overlap the second coupling conductive patterns 850, the second coupling conductive patterns 850 may be formed on the second surface 818.

The second semiconductor chip 820_2 may be connected to the circuit patterns 812_2 of the second package substrate 810_2 by flip-chip bumps 780_2 (see FIG. 14) or bonding wires 888. For example, the second semiconductor chip 820_2 may include transceiver circuits 828_2. The second coupling conductive patterns 850 may be connected to the second semiconductor chip 820_2 by the circuit patterns 812_2 of the second package substrate 810_2 and the bonding wires 888. Since the second semiconductor chip 820_2 is included in the second semiconductor package 800_2 in addition to the first semiconductor chip 820_1 in the first semiconductor package 800_1, the first and second semiconductor packages 800_1 and 800_2 can communicate wirelessly with each other.

The semiconductor device 800 may further include an adhesive layer 860 between the first semiconductor package 800_1 and the second semiconductor package 800_2.

According to the current exemplary embodiment, the first and second coupling conductive patterns 830 and 850 which communicate wirelessly with each other may be placed to face each other. Since no package substrate and/or semiconductor substrate are interposed between the first and second coupling conductive patterns 830 and 850, the communication distance can be reduced, and transmission efficiency can be improved. In addition, conductive media for physical and electrical contact between semiconductor packages that are stacked may not be formed. The absence of the conductive media may decrease the height of the semiconductor device 800 and eliminate connection defects between the first and second semiconductor packages 800_1 and 800_2 which result from contact defects of the conductive media due to warpage and/or misalignment.

FIG. 15B is a plan view of FIG. 15A showing that the second coupling conductive patterns 850 may include an inductor 831. The inductor 831 may have the same or similar shape as any of the inductors described above with reference to FIGS. 4B through 6E. Lead portions 834 of the inductor 831 may be connected to a corresponding one of the circuit patterns 812_2 of the second package substrate 810_2. The second coupling conductive patterns 850 may be formed at the same time as the circuit patterns 812_2 of the second package substrate 810_2. The second coupling conductive patterns 850 may be formed to have the same line width as or a different line width from the circuit patterns 812_2. Alternatively, the second coupling conductive patterns 850 may be manufactured separately and then attached to the second package substrate 810_2.

Figure 16:
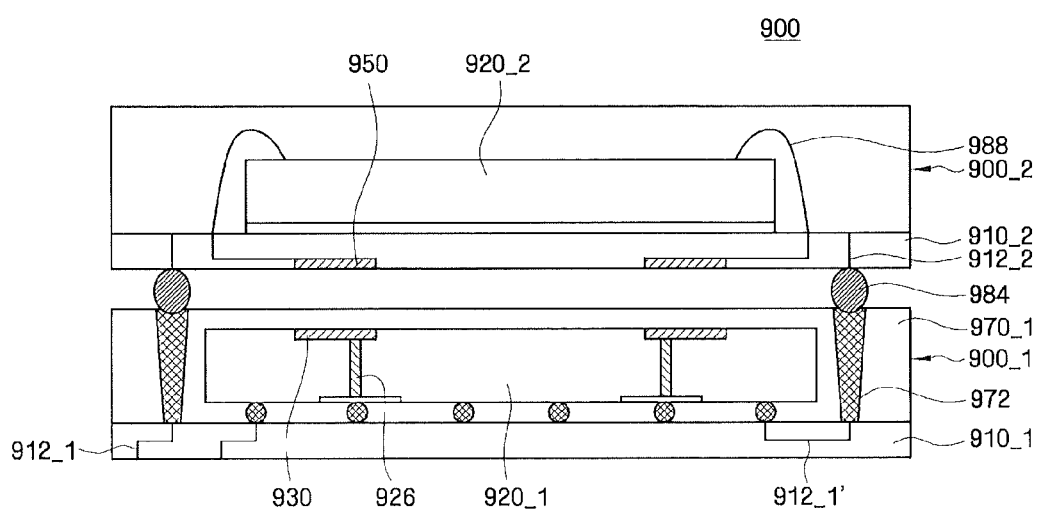

FIG. 16 is a cross-sectional view of a semiconductor device 900 according to another exemplary embodiment of the present invention. Referring to FIGS. 15A and 16, a first semiconductor package 900_1 may further include molding through electrodes 972, which may penetrate at least part of a first protective material 970_1 and connect a first package substrate 910_1 and a second package substrate 910_2. The molding through electrodes 972 may be electrically connected to the outside of the first semiconductor package 900_1 and/or a first semiconductor chip by circuit patterns 912_1 and 912_1' of the first package substrate 910_1. The semiconductor device 900 may further include conductive media 984 which are disposed between the first semiconductor package 900_1 and the second semiconductor package 900_2. The molding through electrodes 972 may be connected to circuit patterns 912_2 of the second package substrate 910_2 by the conductive media 984.

Signals and/or power needed to operate the second semiconductor package 900_2 may be delivered to the second semiconductor package 900_2 via first and second coupling conductive patterns 930 and 950 and/or the molding through electrodes 972. For example, signals may be wirelessly exchanged between the first semiconductor chip 920_1 and the second package substrate 910_2 through the first and second coupling conductive patterns 930 and 950. Power may be delivered from the first package substrate 910_1 to the second package substrate 910_2 through the molding through electrodes 972. In another example, signals and power needed to operate the second semiconductor package 900_2 may be delivered from the first package substrate 910_1 to the second package substrate 910_2 through the molding through electrodes 972. The signals and power delivered to the second package substrate 910_2 may then be delivered to the second semiconductor chip 920_2 through conductive media 780_2 (see FIG. 14) and/or bonding wires 988.

According to the current exemplary embodiment, signals are wirelessly exchanged through the first and second coupling conductive patterns 930 and 950. Thus, the semiconductor device 900 can operate at high speed. In addition, power is delivered through the molding through electrodes 972 and the conductive media 984, thereby reducing power loss. Furthermore, since signals are wirelessly delivered, the number of the molding through electrodes 972 and the number of the conductive media 984 can be reduced, which, in turn, reduces the size of the semiconductor device 900.

Figure 17A:
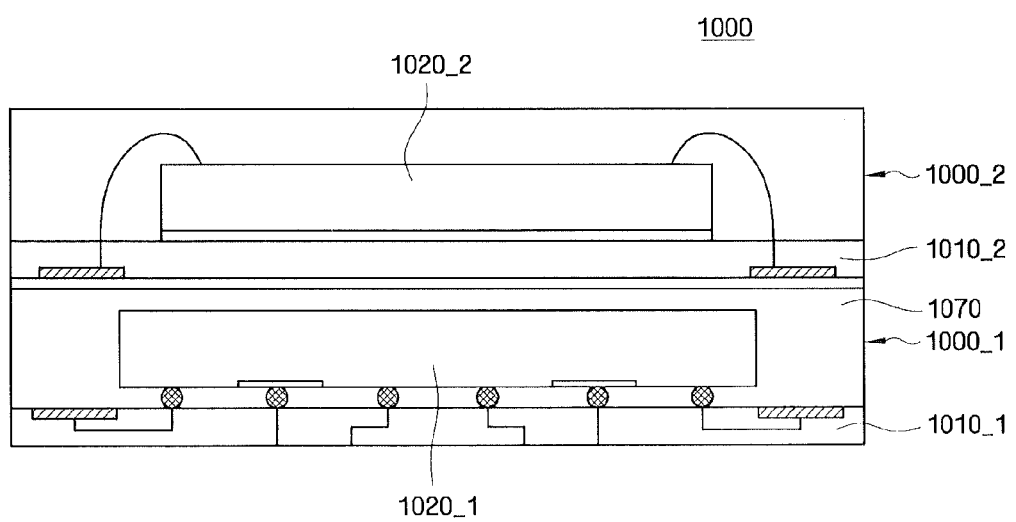
Figure 17B:
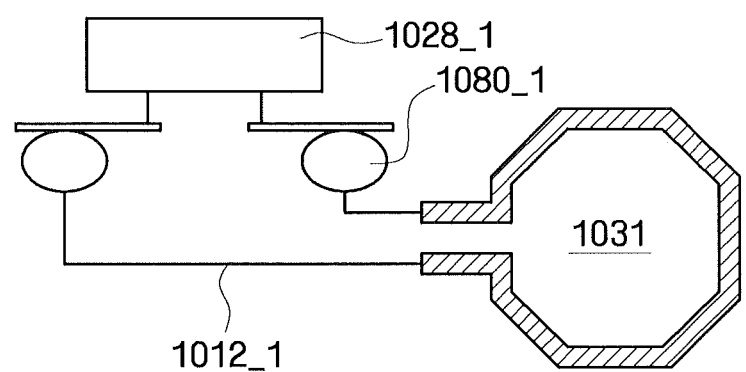

FIGS. 17A and 17B are cross-sectional and partial pan views of a semiconductor device 1000 according to another exemplary embodiment of the present inventive concept. According to the current exemplary embodiment, a first package substrate 1010_1 and a second package substrate 1010_2 included in different semiconductor packages can communicate wirelessly with each other.

Referring to FIG. 17A, the semiconductor device 1000 may include a stack of two or more semiconductor packages. For example, the semiconductor device 1000 may include a first semiconductor package 1000_1 and a second semiconductor package 1000_2 which is stacked on the first semiconductor package 1000_1. The first semiconductor package 1000_1 may include the first package substrate 1010_1 and a first semiconductor chip mounted on the first package substrate 1010_1. The second semiconductor package 1000_2 may include the second package substrate 1010_2 and a second semiconductor chip 1020_2 which is mounted on the second package substrate 1010_2.

The first package substrate 1010_1 and/or the second package substrate 1010_2 may be a PCB which includes circuit patterns 1012_1 or 1012_2. The first package substrate 1010_1 may include first coupling conductive patterns on the surface facing the second semiconductor package 1000_2. The first semiconductor chip 1020_1 may include first transceiver circuits 1028_1 which are electrically connected to the first coupling conductive patterns 1030.

The second package substrate 1010_2 may include second coupling conductive patterns on the surface facing the first semiconductor package 1000_1. The second semiconductor chip 1020_2 may include second transceiver circuits 1028_2 which are electrically connected to the second coupling conductive patterns 1050.

Each of the first and second coupling conductive patterns may respectively include a first inductor 1031 and a second inductor which communicate each other. Referring to FIG. 17B, the first inductor 1031 may be connected to each of the first transceiver circuits 1028_1 by the circuit patterns 1012_1 of the first package substrate 1010_1 and conductive media 1080_1. Signals transmitted or received through the first inductor 1031 may be delivered to the first semiconductor chip 1020_1 and/or the outside of the first semiconductor package 1000_1 via each of the first transceiver circuits 1028_1. The second semiconductor chip 1000_2 may include second transceiver circuits 1028_2 which are connected to the second coupling conductive patterns 1050. The second coupling conductive patterns 1050 may be connected to the second semiconductor chip 1020_2 by the circuit patterns 1012_2 of the second package substrate 1010_2. The second semiconductor chip 1020_2 may be connected to the circuit patterns 1012_2 of the second package substrate 1010_2 by bonding wires 1088, flip-chip bumps, and/or through electrodes.

The first semiconductor package 1000_1 may further include a protective material 1070 which at least partially covers the first package substrate 1010_1 and the first semiconductor package 1020_1. The protective material 1070 may contain an underfill material or an epoxy molding compound. The protective material 1070 may expose the coupling conductive patterns. The semiconductor device 1000 may further include an adhesive layer between the first semiconductor package 1000_1 and the second semiconductor package 1000_2.

According to the current exemplary embodiment, the first semiconductor package 1000_1 and the second semiconductor package 1000_2 include first and second semiconductor chip which include the first and second transceiver circuits. Therefore, the first and second coupling conductive patterns can be formed in the first and second package substrates 1010_1 and 1010_2 without additional transceiver circuits. Since the first and second semiconductor packages 1000_1 and 1000_2 can communicate wirelessly with each other through the first and second coupling conductive patterns 1030 and 1050, they can be connected to each other without conductive media for electrical and/or physical contact between the first and second semiconductor packages 1000_1 and 1000_2. The absence of the conductive media may decrease the height of the semiconductor package and eliminate connection defects between the first and second semiconductor packages 1000_1 and 1000_2 which result from contact defects of the conductive media due to warpage and/or misalignment.

Figure 18:
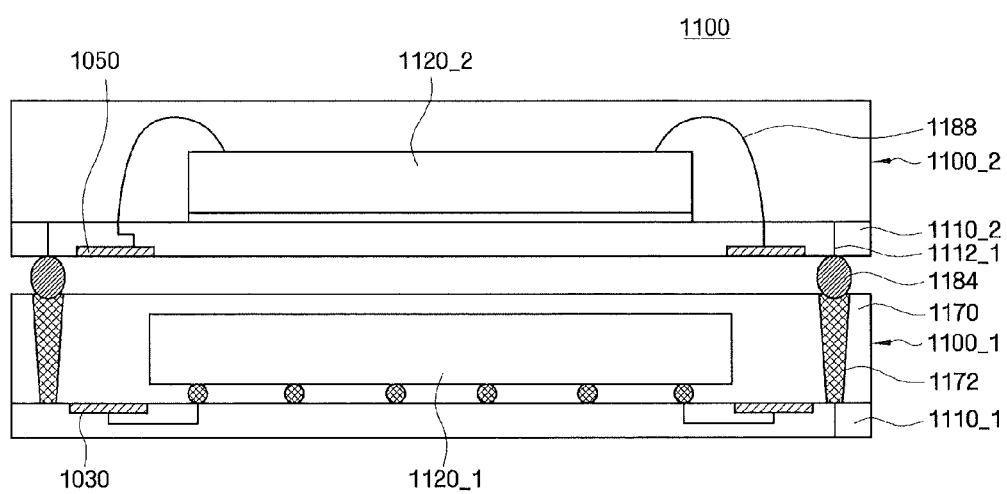

FIG. 18 is a cross-sectional view of a semiconductor device 1100 according to another exemplary embodiment of the present invention. Referring to FIGS. 17A and 18, a first semiconductor package 1100_1 according to the current exemplary embodiment may further include molding through electrodes 1172, which may penetrate at least part of a protective material 1170 and connect a first package substrate 1110_1 and a second package substrate 1110_2. The semiconductor device 1100 may further include conductive media 1184 which are disposed between the first semiconductor package 1100_1 and a second semiconductor package 1100_2. The molding through electrodes 1172 may be connected to circuit patterns 1112_1 of the second package substrate 1110_2 by the conductive media 1184.

Signals and/or power needed to operate the second semiconductor package 1100_2 may be delivered to the second semiconductor package 1100_2 via first and second coupling conductive patterns 1130 and 1150 and/or the molding through electrodes 1172. For example, signals may be wirelessly exchanged between the first and second package substrates 1110_1 and 1110_2 through the first and second coupling conductive patterns 1130 and 1150, and power may be delivered from the first package substrate 1110_1 to the second package substrate 1110_2 via the molding through electrodes 1172. In another example, signals and power needed to operate the second semiconductor package 1100_2 may be delivered from the first package substrate 1110_1 to the second package substrate 1110_2 via the molding through electrodes 1172. The signals and power delivered to the second package substrate 1110_2 may then be delivered to a second semiconductor chip 1120_2 through flip-chip bumps or bonding wires 1188.

According to the current exemplary embodiment, signals are wirelessly exchanged between the first and second semiconductor packages 1100_1 and 1100_2 through the first and second coupling conductive patterns 1130 and 1150. Thus, the semiconductor device 1100 may operate at higher speeds. In addition, power is delivered through the molding through electrodes 1172 and the conductive media 1184, thereby reducing power loss. Furthermore, since signals are wirelessly delivered, the number of the molding through electrodes 1172 and the number of the conductive media 1184 can be reduced, which, in turn, reduces the size of the semiconductor device 1100.

Figure 19:
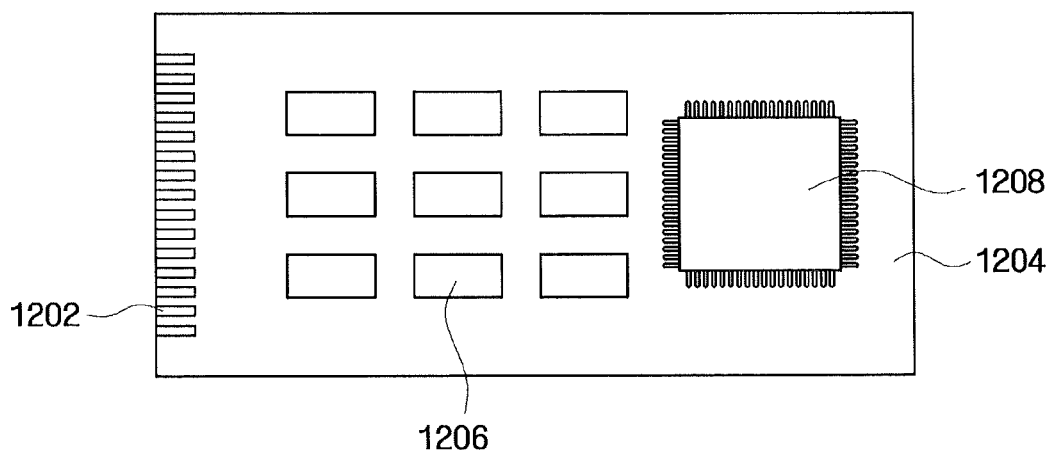
FIG. 19 is a view of a package module according to an exemplary embodiment of the present inventive concepts

FIG. 19 is a plan view of a package module 1200 according to an exemplary embodiment of the present invention.

Referring to FIG. 19, the package module 1200 may include a module substrate 1204 which includes an external connection terminal 1202, semiconductor chips 1206 which are mounted on the module substrate 1204, and a quad flat package (QFP) semiconductor package 1208. The semiconductor chips 1206 and/or the semiconductor package 1208 may include at least one of the semiconductor devices according to the embodiments of FIGS. 1 through 18. For example, the semiconductor package 1208 may be a multi-chip package including a plurality of semiconductor chips which communicate wirelessly with each other or a package-on-package including a stack of a plurality of semiconductor packages which communicate wirelessly with each other. The package module 1200 may be connected to an external electronic device by the external connection terminal 1202.

Figure 20:
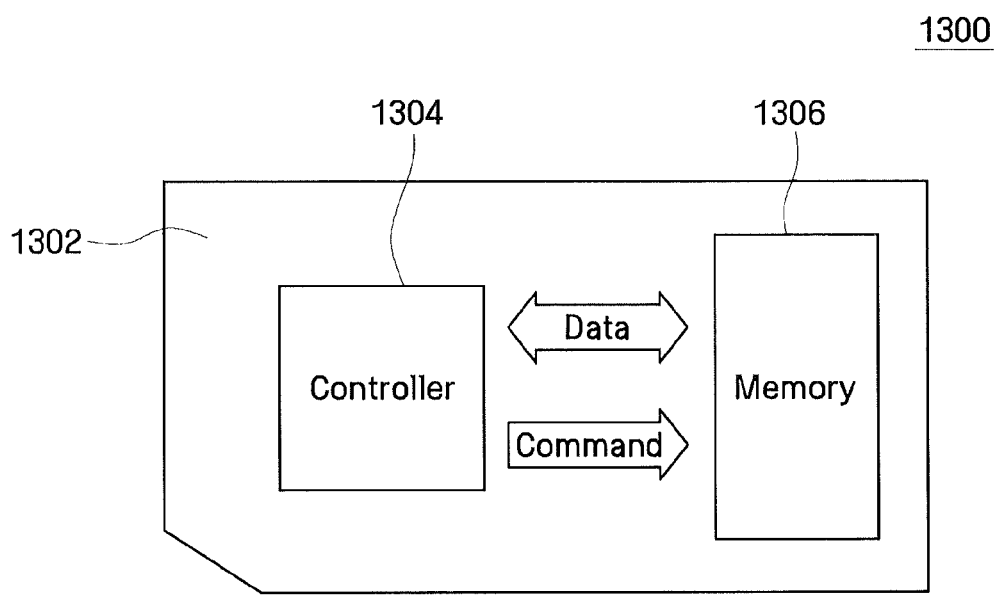
FIG. 20 is a schematic diagram of a memory card according to according to an exemplary embodiment of the present inventive concepts.

FIG. 20 is a schematic diagram of a memory card 1300 according to an exemplary embodiment of the present invention.

Referring to FIG. 20, the memory card 1300 may include a controller 1304 and a memory 1306 in a housing 1302. The controller 1304 and the memory 1306 may exchange electrical signals with each other. For example, the controller 1304 and the memory 1306 may exchange data with each other in response to a command from the controller 1304. Accordingly, the memory card 1300 may store data in the memory 1306 or output the data from the memory 1306 to an external destination.

The controller 1304 and/or the memory 1306 may be included in the semiconductor devices according to the embodiments of FIGS. 1 through 18. For example, a logic chip having the controller 1304 and a memory chip having the memory 1306 may be included in a system-in package and may communicate wirelessly with each other. The system-in package may be provided to the semiconductor device 300 of FIG. 2B. The memory card 1300 may be used as a data storage medium of various portable devices. Examples of the memory card 1300 include a multimedia card (MMC) and a secure digital (SD) card.

Figure 21:
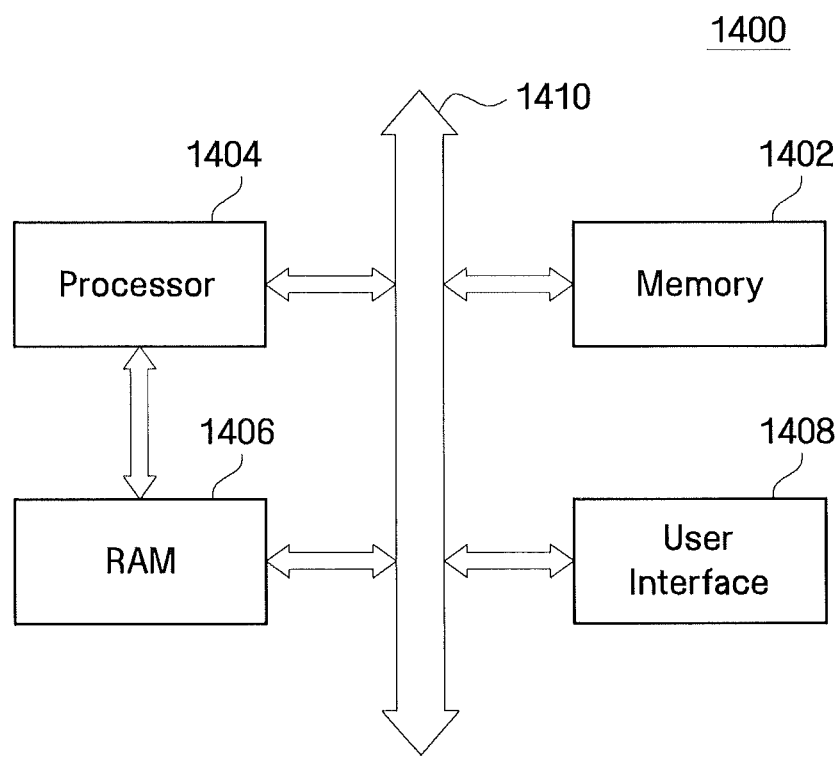
FIG. 21 is a block diagram of an electronic system according to according to an exemplary embodiment of the present inventive concepts.

FIG. 21 is a block diagram of an electronic system 1400 according to an exemplary embodiment of the present invention. Referring to FIG. 21, the electronic system 1400 may include at least one of the semiconductor devices according to the embodiments of FIGS. 1 through 18. The electronic system 1400 may be applied to mobile devices, computers, and the like. For example, the electronic system 1400 may include a memory system 1402, a processor 1404, a random access memory (RAM) 1406, and a user interface 1408. These elements may exchange data with each other by using a bus 1410.

The processor 1404 may execute a program and control the electronic system 1400. The RAM 1406 may be used as a dynamic memory of the processor 1404. The processor 1404 and the RAM 1406 may be included in one semiconductor package. For example, a logic chip having the processor 1404 and a memory chip having the RAM 1406 may be included in a system-in package and may communicate wirelessly with each other. The system-in package may be provided to the semiconductor device 300 of FIG. 2B. The user interface 1408 may be used to input or output data to/from the electronic system 1400. The memory system 1402 may store codes needed to operate the processor 1404, data processed by the processor 1404, and/or data input from an external source. The memory system 1402 may include a controller and a memory and may be configured in substantially the same or similar manner as the memory card 1300 of FIG. 20.

Figure 22:
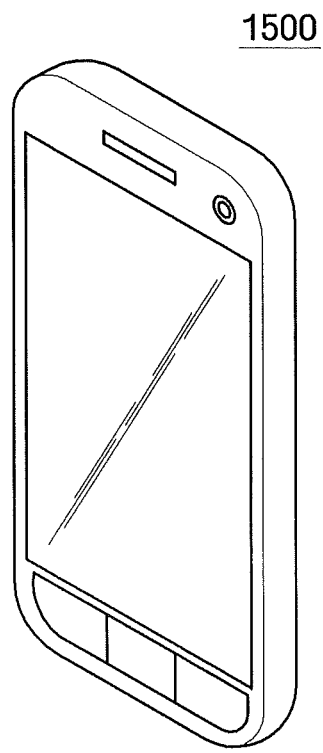
FIG. 22 is a perspective view of an electronic device according to according to an exemplary embodiment of the present inventive concepts.

The electronic system 1400 of FIG. 21 can be applied to an electronic controller of various electronic devices. FIG. 22 is a diagram illustrating a case where the electronic system 1400 (see FIG. 21) is applied to a mobile phone 1500. The electronic system 1400 (see FIG. 21) can also be applied to portable game players, portable notebooks, MP3 players, navigations, solid-state disks (SSDs), vehicles, and household appliances.

As described above, in a semiconductor device according to the present invention, the distance between coupling conductive patterns which communicate wirelessly with each other is reduced, thereby improving signal transmission efficiency. In addition, since the size of the coupling conductive patterns is reduced, the size of an electronic device can be reduced. Furthermore, the number of physical conductive media formed between transceivers which communicate wirelessly with each other is reduced, or no conductive media are formed. This decreases the height of the semiconductor device and eliminates connection defects between electronic devices which may result from contact defects of the conductive media due to warpage and/or misalignment.

The present inventive concepts provide a semiconductor device which may include a package with a semiconductor chip and a transceiver. The semiconductor chip and transceiver may be stacked and communicate wirelessly with each other. The semiconductor chip may include a semiconductor substrate, a through electrode which penetrates at least part of the semiconductor substrate, and a first coupling conductive pattern electrically connected to the through electrode. The transceiver may include a second coupling conductive pattern which communicates wirelessly with the first coupling conductive pattern, and the two coupling conductive pattern may be placed to face each other separated by a selected distance.

According to another embodiment, a semiconductor device includes a semiconductor chip, which may include a through electrode and a coupling conductive pattern. Specifically, the semiconductor chip may include a circuit portion formed on a first surface, a coupling conductive pattern formed on a second surface, and a through electrode which connects the circuit portion and the coupling conductive pattern.

Another embodiment provides a semiconductor device including a first semiconductor package with a first coupling conductive pattern, and a second semiconductor package with a second package substrate having a second coupling conductive pattern, which communicate wirelessly with each other.

According to other embodiments of the present inventive concepts, a method of operating a semiconductor device includes transmitting signals between circuits through wireless communication, and transmitting power through a conductive medium, or transmitting both power and signals between circuits wirelessly via either inductive or capacitive coupling. Transmitting power or signals between circuits may include transmission between separate semiconductive substrates, separate semiconductor chips, and separate semiconductor packages.

An embodiment provides a semiconductor device including a first semiconductor chip with a transceiver circuit formed on a first surface, a first coupling conductive pattern formed on a second surface opposite the first surface, and a through electrode connecting the transceiver circuit and the first coupling conductive pattern. A transceiver located on the first semiconductor chip may have a second coupling conductive pattern communicating wirelessly with the first coupling conductive pattern, and the second coupling conductive pattern faces the first coupling conductive pattern.

Another embodiment provides a first semiconductor chip with a first and second surface, with a circuit portion formed on the first surface, and a first inductor formed on the second surface. There may be a first through electrode connecting the circuit portion and the first inductor, and a second semiconductor chip disposed on the second surface of the first semiconductor chip and having a second inductor which faces the first inductor, so that the first and semiconductor chips may communicate wirelessly with each other through the first and second inductors.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A semiconductor device comprising:
   a first semiconductor chip comprising a transceiver circuit formed on a first surface, a first coupling conductive pattern formed on a second surface opposite the first surface, and a through electrode connecting the transceiver circuit and the first coupling conductive pattern; and a transceiver located on the first semiconductor chip and comprising a second coupling conductive pattern configured to wirelessly communicate data with the first coupling conductive pattern, wherein the second coupling conductive pattern is disposed to face the first coupling conductive pattern, wherein the first coupling conductive pattern is a first inductor, and the second coupling conductive pattern is a second inductor, wherein each of the first and second inductors comprises a field portion and a lead portion which branches from the field portion and is connected to the through electrode, wherein the field portion is loop shaped, wherein each of the first and second inductors further comprise a first connection portion interposed between the lead portion and the field portion and formed at a different level from the lead portion and the field portion, and electrically connecting the lead portion and the field portion.

2. The semiconductor device of claim 1, wherein the first semiconductor chip comprises a semiconductor substrate, and the through electrode penetrates the semiconductor substrate.

3. The semiconductor device of claim 1, wherein the field portion comprises a first sub-field portion and a second sub-field portion formed at the same level and, and each of the first and second inductors further comprise a second connection portion formed at a different level from the first and second sub-field portions and electrically connecting the first and second sub-field portions.

4. The semiconductor device of claim 1, wherein the lead portion comprises a first sub-lead portion and a second sub-lead portion connected to the field portion, and the through electrode comprises a first through electrode connected to the first sub-lead portion and a second through electrode connected to the second sub-lead portion.

5. The semiconductor device of claim 1, wherein the transceiver is a second semiconductor chip.

6. The semiconductor device of claim 1, wherein the transceiver is a printed circuit board (PCB).

* * * * *